US012625196B2

(12) United States Patent (10) Patent No.: US 12,625,196 B2
Sakurazawa et al. (45) Date of Patent: May 12, 2026

(54) DETECTION APPARATUS AND DETECTION METHOD

(71) Applicant: Sumitomo Electric Industries, Ltd., Osaka (JP)

(72) Inventors: Satoru Sakurazawa, Osaka (JP); Masato Izawa, Osaka (JP); Isao Kato, Osaka (JP); Takumi Asaina, Osaka (JP); Shota Shimizu, Osaka (JP); Kanata Nishida, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 240 days.

(21) Appl. No.: 18/566,116

(22) PCT Filed: May 16, 2022

(86) PCT No.: PCT/JP2022/020405
§ 371 (c)(1),
(2) Date: Dec. 1, 2023

(87) PCT Pub. No.: WO2022/255077
PCT Pub. Date: Dec. 8, 2022

(65) Prior Publication Data
US 2024/0288511 A1 Aug. 29, 2024

(30) Foreign Application Priority Data
Jun. 2, 2021 (JP) ................................. 2021-092768

(51) Int. Cl.
*G01R 31/58* (2020.01)
*H04B 3/46* (2015.01)

(52) U.S. Cl.
CPC ............... *G01R 31/58* (2020.01); *H04B 3/46* (2013.01)

(58) Field of Classification Search
CPC .......... G01R 31/58; G01R 31/54; H04B 3/46
See application file for complete search history.

(56) References Cited

U.S. PATENT DOCUMENTS 5,521,548 A * 5/1996 Sugawara ........... H04L 27/2332
                                                                  455/337
2005/0233701 A1 * 10/2005 Martinez ............. H04L 25/0288
                                                                  455/67.11
(Continued)

FOREIGN PATENT DOCUMENTS

JP      2006-029801 A      2/2006
JP      2008-309492 A      12/2008
(Continued)

*Primary Examiner* — Akm Zakaria
(74) *Attorney, Agent, or Firm* — XSENSUS LLP

(57) ABSTRACT
A detection apparatus according to the present disclosure includes a signal output unit configured to output a measurement signal that includes a component having a first frequency to a transmission line, a signal measurement unit configured to measure a response signal, from the transmission line, to the measurement signal output from the signal output unit and a processing unit configured to generate a difference signal that is a difference between the response signal measured by the signal measurement unit and a reference signal that is based on the measurement signal, calculate an index value that indicates a strength of a correlation between the reference signal and the difference signal, and detect an abnormality in the transmission line on the basis of the calculated index value.

20 Claims, 16 Drawing Sheets

(56)        References Cited

U.S. PATENT DOCUMENTS

| | | | | |
|---|---|---|---|---|
| 2015/0253370 A1* | 9/2015 | Fantoni | .................. | G01R 31/58 |
| | | | | 702/58 |
| 2016/0381059 A1* | 12/2016 | Galula | .................... | H04L 63/02 |
| | | | | 726/23 |
| 2017/0134215 A1* | 5/2017 | Chini | .................. | H04L 41/0631 |
| 2018/0284179 A1* | 10/2018 | Hashizume | ........... | G01R 31/70 |
| 2020/0083964 A1* | 3/2020 | Vella-Coleiro | ........ | H04B 17/16 |
| 2020/0116777 A1* | 4/2020 | Cabanillas | ............. | G01R 31/08 |

FOREIGN PATENT DOCUMENTS

| | | | |
|---|---|---|---|
| JP | 2012-122748 A | 6/2012 |
| JP | 2015-536456 A | 12/2015 |
| JP | 2018-179531 A | 11/2018 |
| JP | 2021-081305 A | 5/2021 |

* cited by examiner

Time [second]

Time [second]

DETECTION APPARATUS AND DETECTION METHOD

CROSS-REFERENCE TO RELATED APPLICATIONS

The present application is based on PCT filing PCT/JP2022/020405, filed May 16, 2022, which claims priority from Japanese Patent Application No. 2021-092768, filed Jun. 2, 2021, the disclosure of each is incorporated herein in its entirety by reference.

TECHNICAL FIELD

The present disclosure relates to a detection apparatus and a detection method.

BACKGROUND

PTL 1 (Japanese Unexamined Patent Application Publication No. 2015-536456) discloses a method for monitoring a condition of an electrical cable. The method includes applying a broadband signal wave to an end of the electrical cable, wherein the broadband signal wave is phase and amplitude modulated, acquiring at the end of the cable the broadband signal wave transmitted and reflected by the electrical cable, and identifying impedance characteristics by using the acquired broadband signal wave.

For example, PTL 2 (Japanese Unexamined Patent Application Publication No. 2018-179531) discloses a transmission apparatus as follows. Specifically, in the transmission apparatus in which a first card and a second card are connected via a connector, the transmission apparatus includes a signal generation unit that outputs an AC signal having a frequency higher than the transmission rate of data input to the transmission apparatus, and a judgment unit that receives the AC signal via the connector and judges whether the first card and the second card are fitted with the connector on the basis of the power level of the received AC signal.

PRIOR ART DOCUMENT

Patent Literature

PTL 1: Japanese Unexamined Patent Application Publication No. 2015-536456
PTL 2: Japanese Unexamined Patent Application Publication No. 2018-179531

SUMMARY

A detection apparatus according to the present disclosure includes a signal output unit configured to output a measurement signal that includes a component having a first frequency to a transmission line; a signal measurement unit configured to measure a response signal, from the transmission line, to the measurement signal output from the signal output unit; and a processing unit configured to generate a difference signal that is a difference between the response signal measured by the signal measurement unit and a reference signal that is based on the measurement signal, calculate an index value that indicates a strength of a correlation between the reference signal and the difference signal, and detect an abnormality in the transmission line on the basis of the calculated index value.

A detection method according to the present disclosure is a detection method performed in a detection apparatus. The method includes outputting a measurement signal that includes a component having a first frequency to a transmission line; measuring a response signal, from the transmission line, to the measurement signal; and calculating an index value that indicates a strength of a correlation between the measured response signal and a reference signal based on the measurement signal and detecting an abnormality in the transmission line on the basis of the calculated index value.

One aspect of the present disclosure can be achieved not only as a detection apparatus including such a characteristic processing unit but also as a semiconductor integrated circuit that achieves a part or all of the detection apparatus or as a system including the detection apparatus.

DETAILED DESCRIPTION

Figure 1:
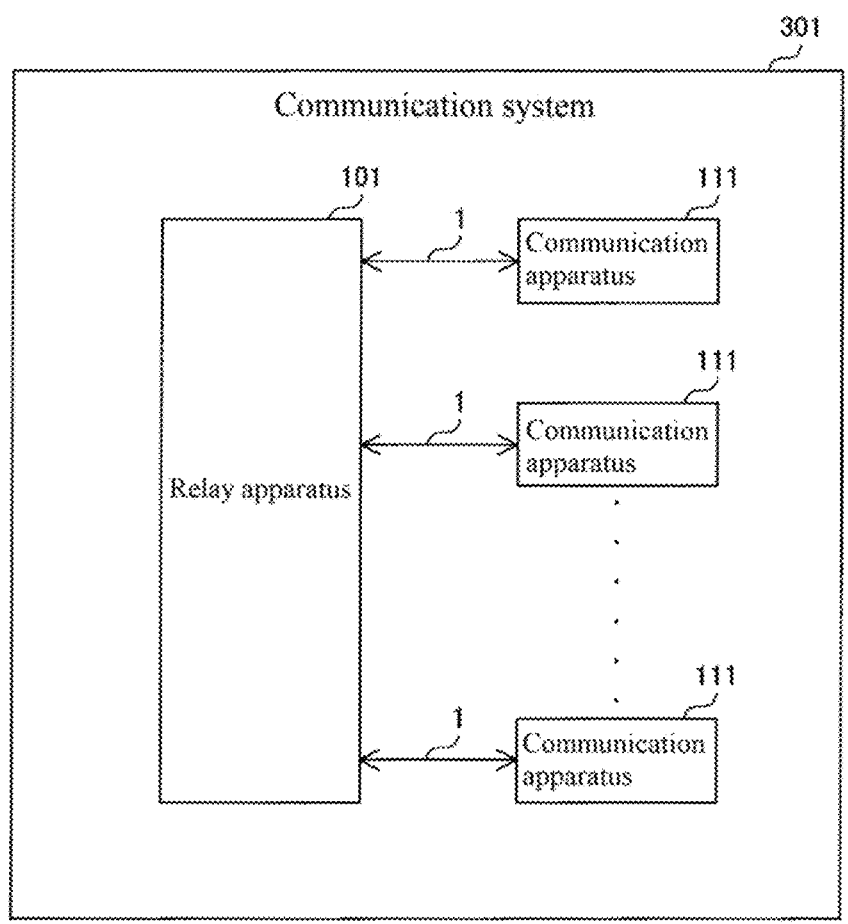
FIG. 1 is a diagram showing a configuration of a communication system according to a first embodiment of the present disclosure.

Conventionally, a technique for detecting an abnormality of a transmission line has been proposed.

Problems to be Solved by Present Disclosure

Beyond the techniques described in PTLs 1 and 2, a technique with which an abnormality in a transmission line can be detected with simple processing and configuration is desired.

The present disclosure has been made to solve the above-described problem, and an object thereof is to provide a detection apparatus and a detection method with which an abnormality in a transmission line can be detected with simple processing and configuration.

Advantageous Effects of Present Disclosure

According to the present disclosure, an abnormality in a transmission line can be detected with simple processing and configuration.

Description of Embodiments of Present Disclosure

First, the contents of embodiments of the present disclosure will be listed and explained.

(1) A detection apparatus according to the present disclosure includes a signal output unit configured to output a measurement signal that includes a component having a first frequency to a transmission line; a signal measurement unit configured to measure a response signal, from the transmission line, to the measurement signal output from the signal output unit; and a processing unit configured to generate a difference signal that is a difference between the response signal measured by the signal measurement unit and a reference signal that is based on the measurement signal, calculate an index value that indicates a strength of a correlation between the reference signal and the difference signal, and detect an abnormality in the transmission line on the basis of the calculated index value.

As described above, by generating a difference signal that is a difference between the response signal from the transmission line when the measurement signal is output to the transmission line and the reference signal based on the measurement signal, and detecting the abnormality in the transmission line based on the index value indicating the strength of correlation between the reference signal and the difference signal, sine waves and rectangular waves of various frequencies from low frequency to high frequency, for example, can be used as the measurement signal, and the abnormality can be detected based on the phase difference between the reference signal and the difference signal by simple calculation processing without using a circuit such as a directional coupler for extracting a reflection signal generated in the transmission line. Thus, the abnormality in a transmission line can be detected with simple processing and configuration.

(2) In (1), the processing unit may be configured to calculate, as the index value, a phase difference between a component having the first frequency and included in the reference signal and a component having the first frequency and included in the difference signal.

With such a configuration, it is possible to detect the abnormality in the transmission line by focusing on a phase shift of a signal in the transmission line. In addition, since the effect of noise can be reduced as compared with a configuration in which, for example, a reflection coefficient is calculated as an index value other than the phase difference, it is possible to more accurately detect the abnormality in the transmission line.

(3) In (1) or (2), the processing unit may be configured to calculate, as the index value, a reflection coefficient between the reference signal and the difference signal. With such a configuration, it is possible to detect the abnormality in the transmission line by focusing on the attenuation amount of the signal in the transmission line.

(4) In any one of (1) to (3), the processing unit may be configured to calculate the index value by using an output signal output from a first filter in response to input, into the first filter, of a multiplication signal obtained from the difference signal and the reference signal, the first filter being configured to extract a direct-current component, and by using an output signal output from a second filter in response to input, into the second filter, of a multiplication signal obtained from the difference signal and a signal that is obtained by shifting a phase of a component having the first frequency and included in the reference signal by $\pi/2$, the second filter being configured to extract a direct-current component.

With such a configuration, noise resistance can be improved, and thus it is possible to more accurately detect the abnormality in the transmission line.

(5) In any one of (1) to (3), the processing unit may be configured to calculate the index value by using an output signal output from a third filter in response to input, into the third filter, of a multiplication signal obtained from the difference signal and a signal that includes a component having a second frequency different from the first frequency, the third filter being configured to extract a component having a difference frequency between the first frequency and the second frequency.

With such a configuration, since it is possible to calculate the index value by processing the low-frequency output signal output from the third filter using a circuit configuration having a lower operating frequency, it is possible to reduce the cost of hardware in the detection apparatus.

(6) In (2), the processing unit may be configured to calculate the phase difference by using an argument of a complex analysis signal of the reference signal and an argument of a complex analysis signal of the difference signal.

With such a configuration, it is possible to simplify arithmetic processing for calculating the phase difference between the reference signal and the difference signal.

(7) In any one of (1) to (6), the processing unit may be configured to generate the difference signal that is a difference between the response signal and the reference signal that is a signal obtained by making a delay adjustment to the measurement signal.

With such a configuration, by generating the difference signal using the response signal and the reference signal subjected to the delay processing according to the length of the transmission line, for example, it is possible to generate the difference signal in which the measurement signal superimposed on the response signal is more accurately canceled. Thus, it is possible to more accurately detect the abnormality in the transmission line using the generated different signal and to more accurately specify the position of occurrence of the abnormality.

(8) In (7), a delay amount of the reference signal relative to the measurement signal may be allowed to be changed and set.

With such a configuration, for example, since the delay amount can be set in accordance with the length of the transmission line, it is possible to more accurately detect the abnormality in the transmission lines having various lengths and to more accurately determine the position of occurrence of the abnormality.

(9) In any one of (1) to (6), the processing unit may be configured to generate the difference signal that is a difference between the response signal and the reference signal that is the response signal measured by the signal measurement unit upon a steady-state time.

With such a configuration, since it is possible to generate the difference signal in which noise is reduced using the response signal upon a steady-state time, it is possible to more accurately detect the abnormality in the transmission line using the generated difference signal.

(10) In any one of (1) to (9), the processing unit may be configured to detect a position of occurrence of the abnormality.

With such a configuration, when the abnormality occurs, it is possible to take appropriate measures such as repair or replacement of the position of occurrence of the abnormality.

(11) A detection method according to the present disclosure is a detection method performed in a detection apparatus. The method includes outputting a measurement signal that includes a component having a first frequency to a transmission line; measuring a response signal, from the transmission line, to the measurement signal; and calculating an index value that indicates a strength of a correlation between the measured response signal and a reference signal based on the measurement signal and detecting the abnormality in the transmission line on the basis of the calculated index value.

As described above, according to the method of generating the difference signal that is a difference between the response signal from the transmission line when the measurement signal is output to the transmission line and the reference signal based on the measurement signal and detecting the abnormality in the transmission line based on the index value indicating the strength of correlation between the reference signal and the difference signal, sine waves and rectangular waves of various frequencies from low frequency to high frequency, for example, can be used as the measurement signal, and the abnormality can be detected based on the phase difference between the reference signal and the difference signal by simple calculation processing without using a circuit such as a directional coupler for extracting a reflection signal generated in the transmission line. Thus, it is possible to detect the abnormality in the transmission line with simple processing and configuration.

Hereinafter, embodiments of the present disclosure will be described with reference to the drawings. Note that the same or corresponding parts in the drawings are denoted by the same reference numerals, and description thereof will not be repeated. Further, at least some of the embodiments described below may be arbitrarily combined.

First Embodiment

[Configuration and Basic Operation]

FIG. 1 is a diagram showing a configuration of a communication system according to a first embodiment of the present disclosure. Referring to FIG. 1, a communication system 301 includes a relay apparatus 101 and a plurality of communication apparatuses 111.

Relay apparatus 101 is connected to each communication apparatus 111 via a transmission line 1. More specifically, transmission line 1 includes a cable portion and connector portions respectively provided at a first end and a second end of the cable portion. The connector portion provided at the first end of the cable portion is connected to a connector portion of relay apparatus 101. The connector portion provided at the second end of the cable portion is connected to a connector portion of communication apparatus 111. Transmission line 1 is, for example, an Ethernet (registered trademark) cable.

Communication system 301 is mounted on a vehicle, for example. In this case, communication apparatus 111 is, for example, an in-vehicle electronic control unit (ECU). Communication system 301 may be used for a home network or factory automation.

Relay apparatus 101 is capable of communicating with communication apparatus 111. Relay apparatus 101 performs, for example, relay processing for relaying information exchanged among or between a plurality of communication apparatuses 111 connected to different transmission lines 1. In addition, relay apparatus 101 functions as a detection apparatus and, for example, periodically performs detection processing of detecting an abnormality in transmission line 1.

[Relay Apparatus]

Figure 2:
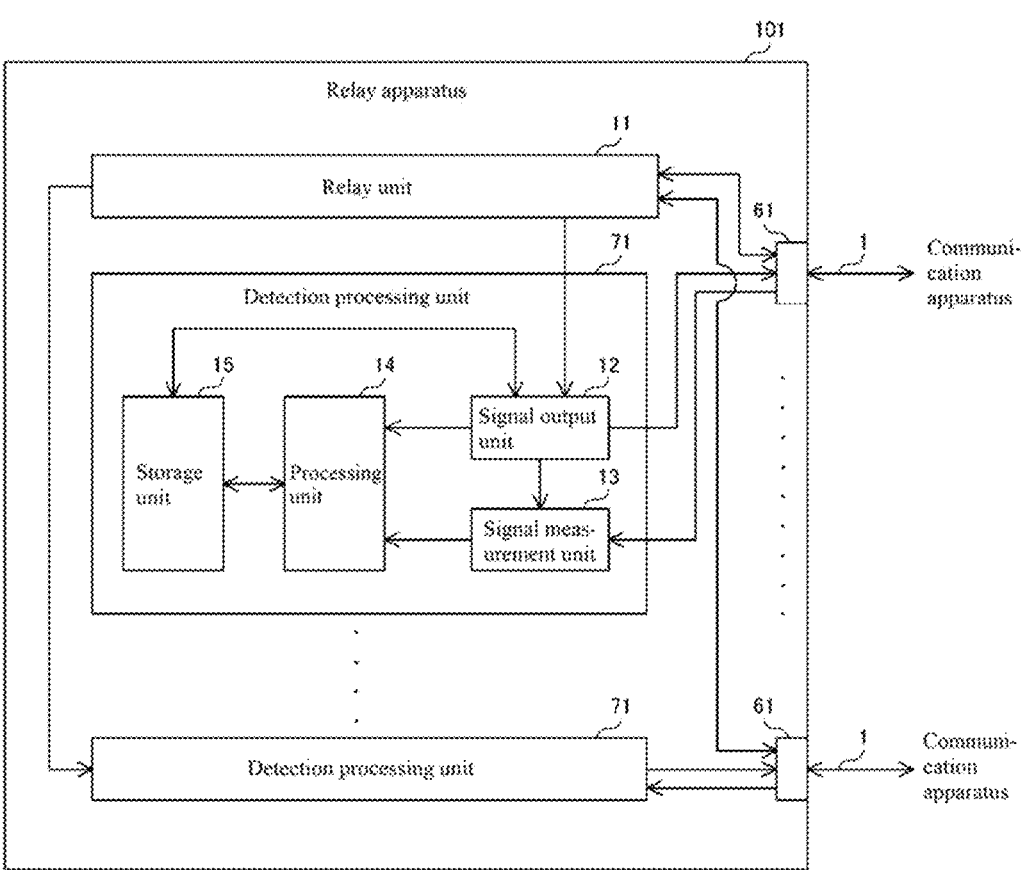
FIG. 2 is a diagram showing a configuration of a relay apparatus according to the first embodiment of the present disclosure.

FIG. 2 is a diagram showing a configuration of a relay apparatus according to a first embodiment of the present disclosure. Referring to FIG. 2, relay apparatus 101 includes a relay unit 11, a plurality of detection processing units 71, and a plurality of communication ports 61. Detection processing unit 71 includes a signal output unit 12, a signal measurement unit 13, a processing unit 14, and a storage unit 15. Some or all of relay unit 11, signal output unit 12, signal measurement unit 13, and processing unit 14 are achieved by a processor such as a central processing unit (CPU) and a digital signal processor (DSP). Storage unit 15 is, for example, a nonvolatile memory. Communication port 61 is, for example, a connector or a terminal. A connector portion of transmission line 1 is connected to each communication port 61.

[Relay Unit]

Relay unit 11 performs relay processing. For example, relay unit 11 performs relay processing of relaying a frame between communication apparatuses 111. More specifically, relay unit 11 transmits a frame received from a certain communication apparatus 111 via the corresponding transmission line 1 and the corresponding communication port 61 to another communication apparatus 111 via the corresponding communication port 61 and the corresponding transmission line 1 in accordance with the destination IP address of the frame.

[Detection Processing Unit]

For example, relay apparatus 101 includes the same number of detection processing units 71 as the number of communication ports 61. More specifically, detection processing unit 71 is provided corresponding to communication port 61 and performs detection processing of detecting the abnormality in transmission line 1 connected to the corresponding communication port 61. Hereinafter, detection processing by one detection processing unit 71 in relay apparatus 101 will be described as a representative.

(Signal Output Unit)

Signal output unit 12 outputs a measurement signal to transmission line 1. As an example, signal output unit 12 outputs the measurement signal that is a sine wave of a frequency f to transmission line 1. Frequency f is an example of a first frequency. More specifically, signal output unit 12 outputs a measurement signal ys (t) expressed as a function of time t in an outputting period T1 to transmission line 1 to be detected. Signal output unit 12 may be configured to output a measurement signal not including an offset component to transmission line 1, or may be configured to output a measurement signal including an offset component to transmission line 1.

For example, outputting period T1 is a period in which relay unit 11 does not perform the relay processing via transmission line 1 to be detected. More specifically, relay unit 11 outputs, to signal output unit 12, period information indicating a period during which the relay processing via transmission line 1 is not performed. Signal output unit 12 receives the period information from relay unit 11, and determines outputting period T1 based on the received period information.

For example, storage unit 15 stores digital data Dt of measurement signal ys (t) to be output to transmission line 1 by signal output unit 12 and frequency information indicating the frequency of measurement signal ys (t). Digital data Dt is time-series data including a plurality of values indicating a waveform of a sine wave.

Signal output unit 12 outputs a sine wave having one or more cycles to transmission line 1 to be detected during outputting period T1 using the data-group stored in storage unit 15. More specifically, signal output unit 12 includes a digital to analog converter (DAC). Signal output unit 12 obtains digital data Dt from storage unit 15 at an outputting timing in accordance with a cycle C1 corresponding to a cycle of an operation clock of the DAC, and outputs measurement signal ys (t) generated by converting the obtained digital data Dt into an analog signal by the DAC to transmission line 1 to be detected.

Signal output unit 12 outputs a synchronization signal indicating the detection timing to signal measurement unit 13. When signal output unit 12 outputs the synchronization signal to signal measurement unit 13, signal output unit 12 starts outputting period T1 and outputs measurement signal ys (t) to transmission line 1 to be detected in outputting period T1.

Signal output unit 12 obtains digital data Dt from storage unit 15 at the outputting timing according to cycle C1, and outputs the obtained digital data Dt to processing unit 14 as a digital measurement signal ysd (t) expressed as a function of time t. That is, signal output unit 12 outputs time-series data of the amplitude value of digital data Dt to processing unit 14. Digital measurement signal ysd (t) is an example of a reference signal.

(Signal Measurement Unit)

Signal measurement unit 13 measures a response signal from transmission line 1 to measurement signal ys (t) output by signal output unit 12. For example, signal measurement unit 13 measures a response signal ym (t) expressed as a function of time t in a measurement period Tm.

More specifically, when receiving the synchronization signal from signal output unit 12, signal measurement unit 13 starts measurement period Tm and measures response signal ym (t) in measurement period Tm. The length of measurement period Tm is equal to, for example, the length obtained by subtracting the round-trip propagation time of the measurement signal in transmission line 1 from the length of outputting period T1.

Signal measurement unit 13 includes an analog to digital converter (ADC). Signal measurement unit 13 generates a digital response signal ymd (t) by sampling the voltage level of transmission line 1 by the ADC at the sampling timing according to cycle C1 in measurement period Tm, and outputs the generated digital response signal ymd (t) to processing unit 14.

(Processing Unit)

Processing unit 14 generates a difference signal ydiff (t) that is a difference between response signal ym (t) measured by signal measurement unit 13 and digital measurement signal ysd (t) based on measurement signal ys (t).

More specifically, processing unit 14 generates difference signal ydiff (t) by subtracting digital measurement signal ysd (t) received from signal output unit 12 from digital response signal ymd (t) received from signal measurement unit 13.

Figure 3:
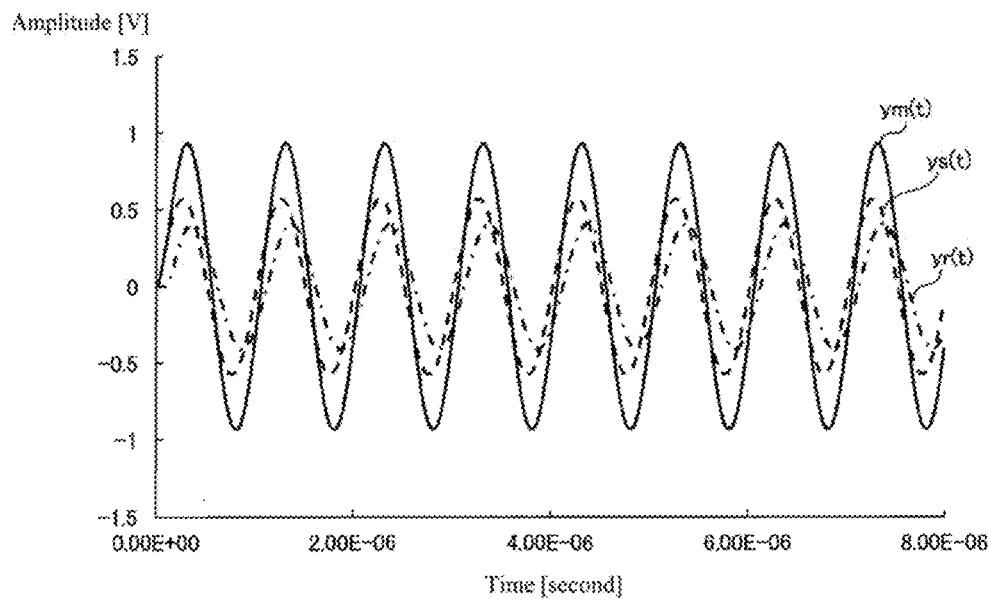
FIG. 3 is a diagram showing a simulation result of a response signal measured by a signal measurement unit in the relay apparatus according to the first embodiment of the present disclosure.

FIG. 3 is a diagram showing a simulation result of a response signal measured by a signal measurement unit in the relay apparatus according to the first embodiment of the present disclosure. In FIG. 3, the horizontal axis represents time [second] and the vertical axis represents amplitude [V] of the signal. The solid line in FIG. 3 represents response signal ym (t), the dashed line in FIG. 3 represents measurement signal ys (t), and the dashed-and-dotted line in FIG. 3 represents a reflection signal yr (t) that is a signal obtained by reflecting measurement signal ys (t) in transmission line 1. FIG. 3 shows a simulation result of each signal when a disconnection occurs at a position 10 m away from the end facing relay apparatus 101 in transmission line 1 having a length of 11 m.

Referring to FIG. 3, response signal ym (t) measured by signal measurement unit 13 is a signal in which measurement signal ys (t) is superimposed on reflection signal yr (t). Processing unit 14 generates difference signal ydiff (t) indicating reflection signal yr (t) by subtracting digital measurement signal ysd (t) from digital response signal ymd (t).

Processing unit 14 calculates a phase difference Φ between the component of frequency f included in digital measurement signal ysd (t) and the component of frequency f included in difference signal ydiff (t), and detects an abnormality in transmission line 1 to be detected based on the calculated phase difference Φ. More specifically, in the detection process, processing unit 14 detects the disconnection in transmission line 1 as the abnormality in transmission line 1 to be detected. For example, processing unit 14 further detects the position of occurrence of the disconnection. Phase difference Φ is an example of an index value indicating a strength of correlation between digital measurement signal ysd (t) and difference signal ydiff (t).

For example, processing unit 14 calculates phase difference Φ using an argument θsd (t) of a complex analysis signal Csd (t) of digital measurement signal ysd (t) and an argument θdiff (t) of a complex analysis signal Cdiff (t) of difference signal ydiff (t).

More specifically, processing unit 14 calculates complex analysis signal Csd (t) by performing a Hilbert transform on digital measurement signal ysd (t) received from signal output unit 12. Further, processing unit 14 calculates complex analysis signal Cdiff (t) by performing the Hilbert transform on the generated difference signal ydiff (t). Processing unit 14 may perform the calculation of complex analysis signal Csd (t) and the calculation of complex analysis signal Cdiff (t) in parallel or sequentially.

Figure 4:
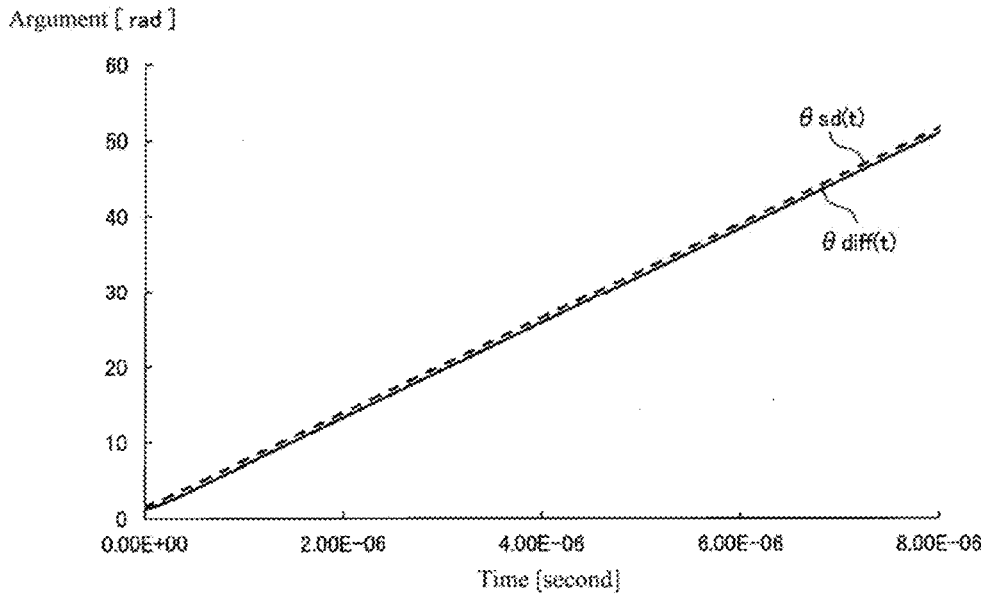
FIG. 4 is a diagram showing a simulation result of an argument of a complex analysis signal calculated by a processing unit in the relay apparatus according to the first embodiment of the present disclosure.

FIG. 4 is a diagram showing a simulation result of an argument of a complex analysis signal calculated by a processing unit in the relay apparatus according to the first embodiment of the present disclosure. In FIG. 4, the horizontal axis represents time [second] and the vertical axis represents an argument [rad]. The solid line in FIG. 4 represents argument θdiff (t) of complex analysis signal Cdiff (t), and the dashed line in FIG. 4 represents argument θsd (t) of complex analysis signal Csd (t). FIG. 4 shows simulation results of argument θdiff (t) and argument θsd (t) calculated by processing unit 14 when the disconnection occurs at a position 10 m away from the end facing relay apparatus 101 in transmission line 1 having a length of 11 m, similarly to FIG. 3.

Processing unit 14 calculates a difference between argument θsd (t) and argument θdiff (t) as phase difference Φ.

Figure 5:
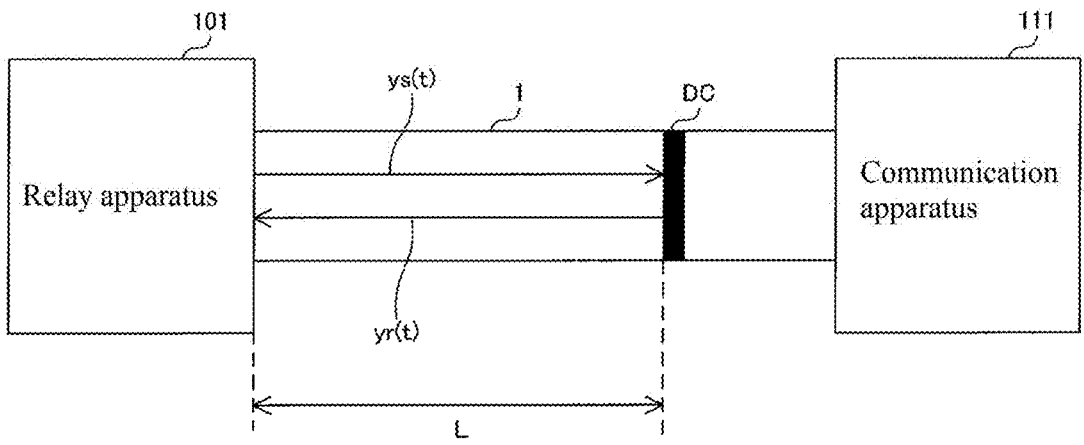
FIG. 5 is a diagram showing a method of specifying a position of occurrence of a disconnection by the processing unit in the relay apparatus according to the first embodiment of the present disclosure.

FIG. 5 is a diagram showing a method of specifying a position of occurrence of disconnection by a processing unit in the relay apparatus according to the first embodiment of the present disclosure. FIG. 5 shows a state where disconnection DC occurs in transmission line 1. For example, transmission line 1 has a configuration in which a termination resistor is not provided at an end portion facing communication apparatus 111.

Referring to FIG. 5, measurement signal ys (t) output to transmission line 1 by signal output unit 12 is reflected at a reflection point in transmission line 1 to generate reflection signal yr (t). For example, when disconnection DC occurs in transmission line 1, measurement signal ys (t) is reflected at the position of disconnection DC. On the other hand, when disconnection DC does not occur in transmission line 1, measurement signal ys (t) is reflected at the end portion facing communication apparatus 111 in transmission line 1.

Phase difference Φ between measurement signal ys (t) and reflection signal yr (t) is expressed by the following equation (1).

[Equation 1]

$$\varphi = \frac{4\pi L f \sqrt{\varepsilon r}}{c} \tag{1}$$

Here, L is the distance [m] from the end portion facing relay apparatus 101 in transmission line 1 to the reflection point of measurement signal ys (t), c is the speed of light [m/sec], and εr is the relative permittivity of transmission line 1.

That is, a distance L from the end portion facing relay apparatus 101 in transmission line 1 to the reflection point of measurement signal ys (t) is represented by the following equation (2). After calculating phase difference Φ, processing unit 14 calculates distance L corresponding to the calculated phase difference Φ in accordance with equation (2).

[Equation 2]

$$L = \frac{c\varphi}{4\pi f \sqrt{\varepsilon r}} \tag{2}$$

Figure 6:
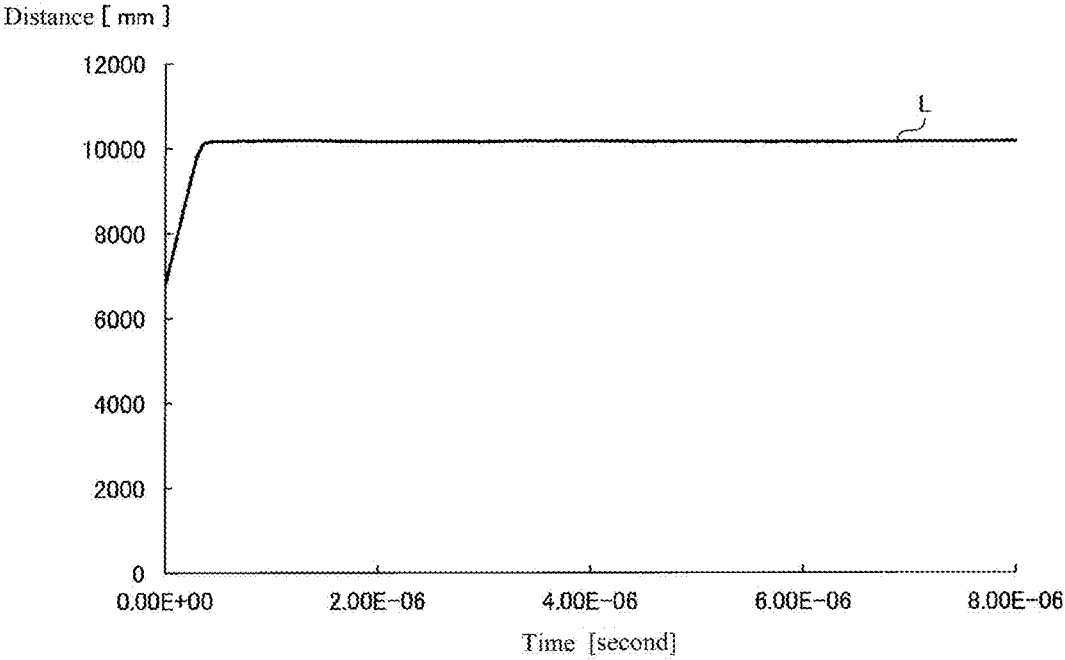
FIG. 6 is a diagram showing a simulation result of a distance calculated by the processing unit in the relay apparatus according to the first embodiment of the present disclosure.

FIG. 6 is a diagram showing a simulation result of a distance calculated by a processing unit in the relay apparatus according to the first embodiment of the present disclosure. In FIG. 6, the horizontal axis represents time [second] and the vertical axis represents the distance [mm] from the end portion facing relay apparatus 101 in transmission line 1 to the reflection point. FIG. 6 shows a simulation result of distance L calculated by processing unit 14 when the disconnection occurs at a position 10 m away from the end facing relay apparatus 101 in transmission line 1 having a length of 11 m, similarly to FIGS. 3 and 4.

Referring to FIG. 6, processing unit 14 determines whether or not a disconnection occurs in transmission line 1 based on the calculated distance L. When the disconnection occurs in transmission line 1, processing unit 14 further detects the position of occurrence of the disconnection in transmission line 1.

More specifically, storage unit 15 stores transmission line information indicating a length Lc of transmission line 1 to be detected.

Processing unit 14 obtains the transmission line information in storage unit 15, and calculates a difference length Ldiff by subtracting the calculated distance L from length Lc of transmission line 1 to be detected indicated by the obtained transmission line information.

Processing unit 14 compares the calculated difference length Ldiff with a predetermined threshold value Th1, and determines whether or not the disconnection has occurred in transmission line 1 based on the comparison result. More specifically, when difference length Ldiff is less than threshold value Th1, processing unit 14 determines that no disconnection has occurred in transmission line 1. On the other hand, when difference length Ldiff is equal to or greater than threshold value Th1, processing unit 14 determines that the disconnection has occurred at the position of distance L from the end portion facing relay apparatus 101 in transmission line 1.

For example, when processing unit 14 determines that the disconnection has occurred in transmission line 1, processing unit 14 notifies the user of the determination result via a communication unit (not illustrated) and communication apparatus 111.

Here, a maximum distance Lmax, which is the maximum value of distance L that can be correctly calculated in processing unit 14, is ½ of a wavelength λ of measurement signal ys (t) and is represented by the following equation (3).

$$Lmax = \frac{\lambda}{2} = \frac{c}{2f\sqrt{\varepsilon r}} \quad (3)$$

For example, frequencies f of measurement signal ys (t) output by signal output unit 12 and the above-described cycles C1 are set in advance such that maximum distance Lmax is equal to or longer than length Lc of transmission line 1 to be detected.

[Operation Flow]

Each device in the communication system according to the embodiment of the present disclosure includes a computer including a memory, and an arithmetic processing unit such as a CPU in the computer reads a program including a part or all of each step of the following flowchart from the memory and executes the program. The programs of the plurality of devices can be installed from the outside. The programs of the plurality of devices are distributed in a state of being stored in a recording medium or via a communication line.

Figure 7:
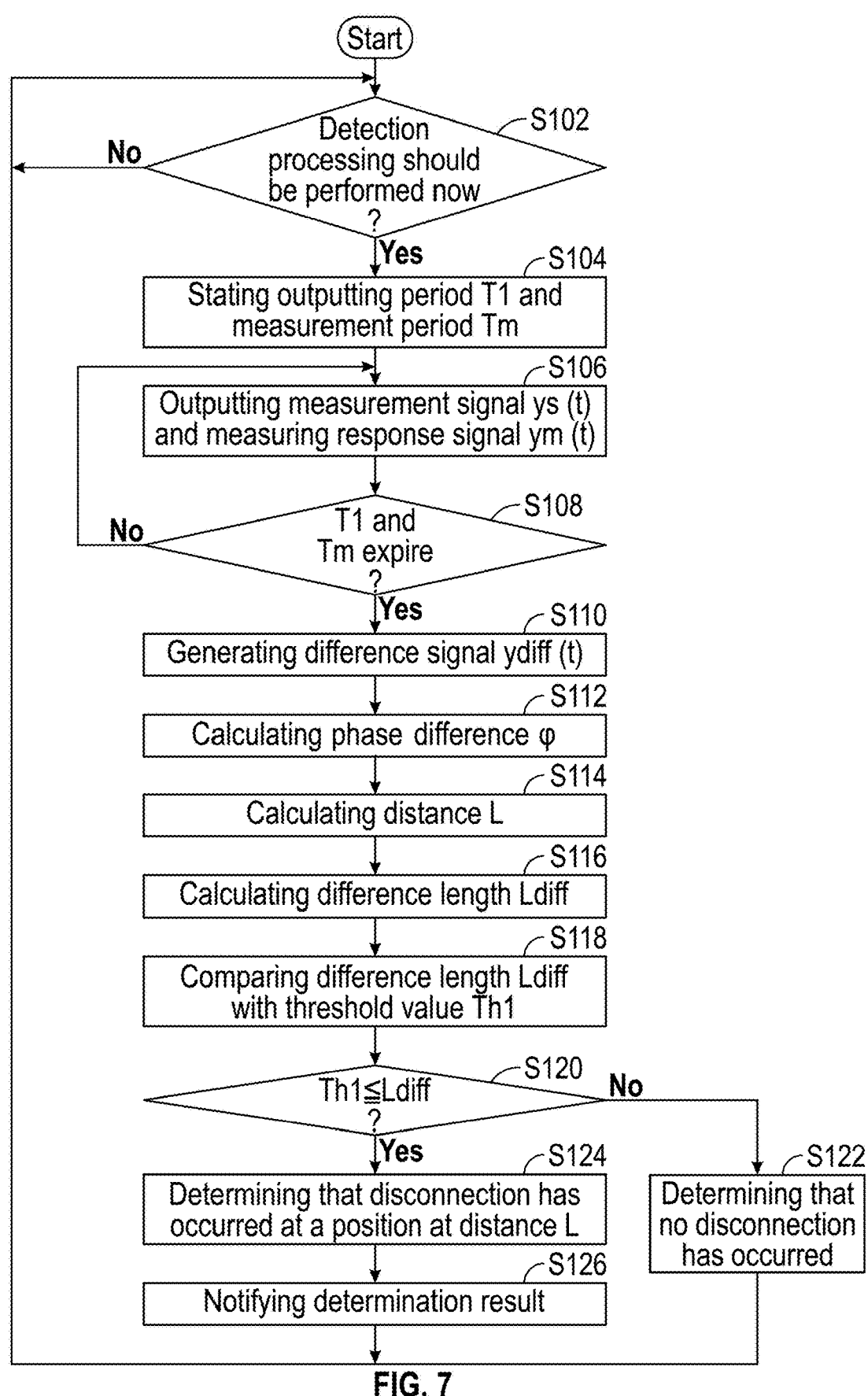
FIG. 7 is a flowchart defining an example of an operation procedure when the relay apparatus according to the first embodiment of the present disclosure performs detection processing.

FIG. 7 is a flowchart defining an example of an operation procedure when the relay apparatus according to the first embodiment of the present disclosure performs detection processing.

Referring to FIG. 7, first, relay apparatus 101 waits for the timing at which the detection processing should be performed (NO in step S102), and starts outputting period T1 and measurement period Tm (step S104) at the timing at which the detection processing should be performed (YES in step S102).

Next, relay apparatus 101 outputs measurement signal ys (t) to transmission line 1 to be detected in outputting period T1, and measures response signal ym (t) from transmission line 1 to measurement signal ys (t) in measurement period Tm. More specifically, relay apparatus 101 outputs measurement signal ys (t) for one sample to transmission line 1, and samples the voltage level of transmission line 1 to generate of digital response signal ymd (t) for one sample (step S106).

Relay apparatus 101 alternately repeats outputting measurement signal ys (t) for one sample and generating digital response signal ymd (t) for one sample until outputting period T1 and measurement period Tm expire (NO in step S108), and generates difference signal ydiff (t) that is a difference between response signal ym (t) and digital measurement signal ysd (t) when outputting period T1 and measurement period Tm expire (YES in step S108). More specifically, relay apparatus 101 generates difference signal ydiff (t) by subtracting digital measurement signal ysd (t) from digital response signal ymd (t) (step S110).

Next, relay apparatus 101 calculates phase difference Φ between the component of frequency f included in digital measurement signal ysd (t) and the component of frequency f included in difference signal ydiff (t). In more detail, relay apparatus 101 calculates phase difference Φ using argument θsd (t) of complex analysis signal Csd (t) of digital measurement signal ysd (t) and argument θdiff (t) of complex analysis signal Cdiff (t) of difference signal ydiff (t) (step S112).

Next, relay apparatus 101 calculates distance L corresponding to phase difference Φ in accordance with the above-described equation (2) (step S114).

Next, relay apparatus 101 calculates difference length Ldiff by subtracting the calculated distance L from length Lc of transmission line 1 to be detected (step S116).

Next, relay apparatus 101 compares the calculated difference length Ldiff with threshold value Th1 (step S118).

Next, when difference length Ldiff is less than threshold value Th1 (NO in step S120), relay apparatus 101 determines that no disconnection has occurred in transmission line 1 (step S122), and waits for a next timing at which the detection processing should be performed (NO in step S102).

On the other hand, when difference length Ldiff is equal to or greater than threshold value Th1 (YES in step S120), relay apparatus 101 determines that the disconnection has occurred at a position at distance L from the end portion facing relay apparatus 101 in transmission line 1 (step S124).

Next, relay apparatus 101 notifies the user of the determination result via the communication unit (not shown) and communication apparatus 111 (step S126), and waits for a next timing at which the detection processing should be performed (NO in step S102).

In communication system 301 according to the first embodiment of the present disclosure, relay apparatus 101 is configured to perform the detection processing, but is not limited thereto. A device other than relay apparatus 101 in communication system 301 may be configured to perform the detection processing. Specifically, communication apparatus 111 may be configured to function as the detection apparatus and perform the detection processing.

Further, in communication system 301 according to the first embodiment of the present disclosure, transmission line 1 is configured to include the cable portion and the connector portion, but is not limited thereto. Transmission line 1 may be a wiring pattern formed on a circuit board. In this case, relay apparatus 101 detects an abnormality in transmission line 1 that is a wiring pattern.

In relay apparatus 101 according to the first embodiment of the present disclosure, processing unit 14 is configured to detect the disconnection in transmission line 1 as an abnormality in transmission line 1 to be detected in the detection processing, but is not limited thereto. Processing unit 14 may be configured to detect connection of an unauthorized device to transmission line 1 as an abnormality in transmission line 1 to be detected. Since the impedance at a connection point changes due to the connection of the unauthorized device to transmission line 1 when an unauthorized device is connected to transmission line 1, measurement signal ys (t) output to transmission line 1 by signal output unit 12 is reflected at the connection point and a reflection signal is generated. Signal measurement unit 13 measures a response signal in which the reflection signal is superimposed on measurement signal ys (t) in the same manner as when a disconnection occurs in transmission line 1. Processing unit 14 compares the absolute value of difference length Ldiff with threshold value Th1. When the absolute value of difference length Ldiff is less than threshold value Th1, processing unit 14 determines that an abnormality such as connection of an unauthorized device has not occurred in transmission line 1. On the other hand, when the absolute value of difference length Ldiff is equal to or larger than threshold value Th1, processing unit 14 determines that an abnormality such as connection of an unauthorized device has occurred.

In relay apparatus 101 according to the first embodiment of the present disclosure, processing unit 14 is configured to calculate phase difference Φ using argument θsd (t) of complex analysis signal Csd (t) of digital measurement signal ysd (t) and argument θdiff (t) of complex analysis signal Cdiff (t) of difference signal ydiff (t), but is not limited thereto. Processing unit 14 may be configured to calculate phase difference Φ without using argument θsd (t) of complex analysis signal Csd (t) and argument θdiff (t) of complex analysis signal Cdiff (t) of difference signal ydiff (t). For example, processing unit 14 may be configured to calculate phase difference Φ by the following procedure.

That is, processing unit 14 normalizes the amplitude of difference signal ydiff (t) and the amplitude of digital measurement signal ysd (t) to a range of ±1. Processing unit 14 calculates a phase P1 of difference signal ydiff (t) by passing the normalized difference signal ydiff (t) through an arcsine that is the inverse of a sine function. In addition, processing unit 14 calculates a phase P2 of digital measurement signal ysd (t) by passing the normalized digital measurement signal ysd (t) through the arcsine that is the inverse of the sine function. Then, processing unit 14 unwraps, for example, phases P1 and P2, and calculates the difference between phases P1 and P2 as phase difference Q.

In addition, in relay apparatus 101 according to the first embodiment of the present disclosure, processing unit 14 is configured to further detect the position of occurrence of the disconnection in transmission line 1 when the disconnection occurs in transmission line 1, but is not limited thereto. Processing unit 14 may be configured to determine whether or not a disconnection occurs in transmission line 1, but not to detect the position of occurrence of the disconnection.

In addition, in communication system 301 according to the first embodiment of the present disclosure, transmission line 1 is configured not to include the termination resistor at the end portion facing communication apparatus 111, but is not limited thereto. Transmission line 1 may be configured to include a termination resistor for impedance matching at an end portion facing communication apparatus 111.

In relay apparatus 101 according to the first embodiment of the present disclosure, processing unit 14 is configured to generate difference signal ydiff (t) by subtracting digital measurement signal ysd (t) from digital response signal ymd (t), but is not limited thereto. Processing unit 14 may be configured to generate difference signal ydiff (t) by analog signal processing using a differential amplifier or the like. In this case, processing unit 14 converts the generated difference signal ydiff (t) into a digital signal using the ADC, calculates phase difference Φ using the digital signal, and detects the disconnection based on the calculated phase difference Φ.

In relay apparatus 101 according to the first embodiment of the present disclosure, signal output unit 12 is configured to output the measurement signal that is a sine wave to transmission line 1, is not limited thereto. Signal output unit 12 may be configured to output a measurement signal having a plurality of frequency components to transmission line 1, or may be configured to output a measurement signal that is a rectangular wave to transmission line 1.

For example, storage unit 15 stores digital data DtRW including a plurality of values indicating a waveform of a rectangular wave. Signal output unit 12 obtains digital data DtRW instead of digital data Dt from storage unit 15 and outputs a signal obtained by converting the obtained digital data DtRW into an analog signal as measurement signal ys (t) to transmission line 1 to be detected.

Here, the rectangular wave includes a frequency component of an odd multiple of the fundamental frequency. Signal measurement unit 13 extracts a part of the frequency components from the analog signal indicating the voltage level of transmission line 1 using, for example, a band pass filter (BPF), generates digital response signal ymd (t) by sampling the extracted analog signal using the ADC, and outputs digital response signal ymd (t) to processing unit 14. Alternatively, a digital signal is generated by sampling the voltage level of transmission line 1 by the ADC, a part of the frequency components is extracted from the digital signal using the BPF, and the extracted digital signal is output to processing unit 14 as digital response signal ymd (t).

Meanwhile, there is a demand for a technique with which a disconnection in a transmission line can be detected with simple processing and configuration.

For example, a technique for detecting characteristics of transmission line 1 using time domain reflectometry (TDR) is conventionally known. When a change in the characteristics of transmission line 1 is detected using such a technique and an abnormality related to transmission line 1 is detected based on the detection result, it is necessary to output a rising pulse to transmission line 1 with high reproducibility in order to accurately detect the change in the characteristics of transmission line 1, and as a result, a high-performance pulse signal generator is required.

In addition, when characteristics such as an S parameter of transmission line 1 are measured using a network analyzer and an abnormality related to transmission line 1 is detected based on the measurement result, in order to obtain sufficient detection accuracy, it is necessary to use an expensive and complicated measurement device and it is necessary to calibrate the measurement device every time measurement is performed.

On the other hand, in relay apparatus 101 according to the first embodiment of the present disclosure, signal output unit 12 outputs the measurement signal including the first frequency component to transmission line 1. Signal measurement unit 13 measures a response signal from transmission line 1 in response to the measurement signal output by signal output unit 12. Processing unit 14 generates a difference signal that is a difference between the response signal measured by signal measurement unit 13 and a reference signal based on the measurement signal, calculates a phase difference that is an index value indicating the strength of correlation between the reference signal and the difference signal, and detects an abnormality in transmission line 1 based on the calculated phase difference.

As described above, by generating a difference signal that is a difference between a response signal from transmission line 1 when a measurement signal is output to transmission line 1 and a reference signal based on the measurement signal, and detecting an abnormality in transmission line 1 based on a phase difference between the reference signal and the difference signal, for example, sine waves and rectangular waves of various frequencies from low frequency to high frequency, for example, can be used as measurement signal, and the abnormality can be detected based on the phase difference between the reference signal and the difference signal by simple calculation processing without using a circuit such as a directional coupler for extracting a reflection signal generated in transmission line 1. Therefore, in relay apparatus 101 according to the first embodiment of the present disclosure, it is possible to detect an abnormality in the transmission line with simple processing and configuration.

Further, as described above, since the abnormality is detected based on the phase difference between the reference signal and the difference signal, it is possible to more accurately detect the abnormality because the resistance to the noise is high compared with a configuration, for example, using the TDR and the network analyzer for analyzing the amplitude of the response signal. In addition, the abnormality can be detected by simple processing without performing arithmetic processing such as fast Fourier transform (FFT). Further, as compared with a configuration using an optical signal or a radio wave, it is possible to detect the abnormality even in a state where a standing wave is generated in transmission line 1.

Next, other embodiments of the present disclosure will be described with reference to the drawings. Note that the same or corresponding parts in the drawings are denoted by the same reference numerals, and description thereof will not be repeated.

Second Embodiment

Compared with relay apparatus 101 according to the first embodiment, the present embodiment relates to a relay apparatus 102 that generates difference signal ydiff (t) using digital measurement signal ysd (t) in storage unit 15. Relay apparatus 102 is the same as relay apparatus 101 according to the first embodiment except for the contents described below.

Figure 8:
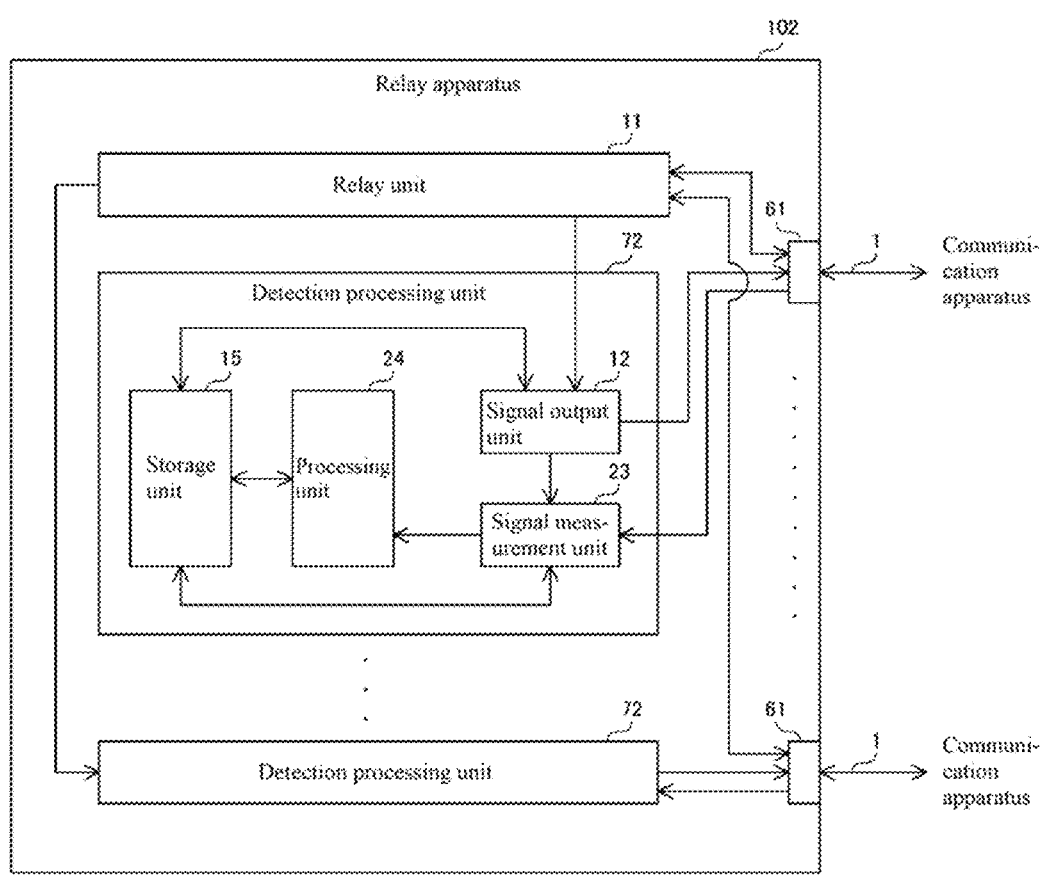
FIG. 8 is a diagram showing a configuration of a relay apparatus according to a second embodiment of the present disclosure.

FIG. 8 is a diagram showing a configuration of a relay apparatus according to a second embodiment of the present disclosure. Referring to FIG. 8, relay apparatus 102 includes a detection processing unit 72 instead of detection processing unit 71, as compared with relay apparatus 101 according to the first embodiment. Detection processing unit 72 includes a signal measurement unit 23 instead of signal measurement unit 13 and a processing unit 24 instead of processing unit 14, as compared with detection processing unit 71. For example, transmission line 1 includes a termination resistor at the end portion facing communication apparatus 111.

Detection processing unit 72 performs reference measurement processing for measuring a response signal in a steady state. More specifically, detection processing unit 72 performs the reference measurement processing in an initial state in which no disconnection occurs in transmission line 1. After performing the reference measurement processing, detection processing unit 72 performs the detection processing, for example, periodically. Detection processing unit 72 may perform the reference measurement processing at regular or irregular intervals after performing the reference measurement processing in the initial state.

(Reference Measurement Processing)

Signal output unit 12 outputs a synchronization signal to signal measurement unit 23, and outputs measurement signal ys (t) to transmission line 1 to be detected in outputting period T1.

When receiving the synchronization signal from signal output unit 12, signal measurement unit 23 starts measurement period Tm and samples the voltage level of transmission line 1 by the ADC at the sampling timing according to cycle C1 in measurement period Tm to generate a digital response signal ymdR (t) that is digital response signal ymd (t) in the steady state. Signal measurement unit 23 stores the generated digital response signal ymdR (t) in storage unit 15. Digital response signal ymdR (t) is an example of a reference signal.

(Detection Processing)

As in the reference measurement processing, signal output unit 12 outputs the synchronization signal to signal measurement unit 13 and outputs measurement signal ys (t) to transmission line 1 to be detected in outputting period T1.

When receiving the synchronization signal from signal output unit 12, signal measurement unit 23 starts measurement period Tm, and samples the voltage level of transmission line 1 by the ADC at the sampling timing according to cycle C1 in measurement period Tm to generate a digital response signal ymdS (t) that is digital response signal ymd (t) at the time of operation. Signal measurement unit 23 outputs the generated digital response signal ymdS (t) to processing unit 24.

Processing unit 24 generates difference signal ydiff (t) that is a difference between response signal ym (t) and digital response signal ymdR (t) that is response signal ym (t) measured by signal measurement unit 23 in the steady state.

More specifically, processing unit 24 receives digital response signal ymdS (t) from signal measurement unit 23, obtains digital response signal ymdR (t) from storage unit 15, and generates difference signal ydiff (t) by subtracting digital response signal ymdR (t) from digital response signal ymdS (t).

Processing unit 24 calculates a complex analysis signal CmdR (t) by performing the Hilbert transform on digital response signal ymdR (t) obtained from storage unit 15. Further, processing unit 24 calculates complex analysis signal Cdiff (t) by performing the Hilbert transform on the generated difference signal ydiff (t). Then, processing unit 24 calculates the difference between an argument θmdR (t) of complex analysis signal CmdR (t) and argument θdiff (t) of complex analysis signal Cdiff (t) as phase difference Φ.

After calculating phase difference Φ, processing unit 24 calculates distance L corresponding to the calculated phase difference Φ in accordance with the above-described equation (2).

Processing unit 24 determines whether or not a disconnection has occurred in transmission line 1 based on the calculated distance L. When a disconnection occurs in transmission line 1, processing unit 24 further detects the position of occurrence of the disconnection in transmission line 1.

For example, processing unit 24 compares the calculated distance L with a predetermined threshold value Th2, and determines whether or not the disconnection has occurred in transmission line 1 based on the comparison result. More specifically, when the calculated distance L is less than threshold value Th2, processing unit 24 determines that no disconnection has occurred in transmission line 1. On the other hand, when the calculated distance L is equal to or greater than threshold value Th2, processing unit 24 determines that the disconnection has occurred at the position of distance L from the end portion facing relay apparatus 102 in transmission line 1.

Figure 9:
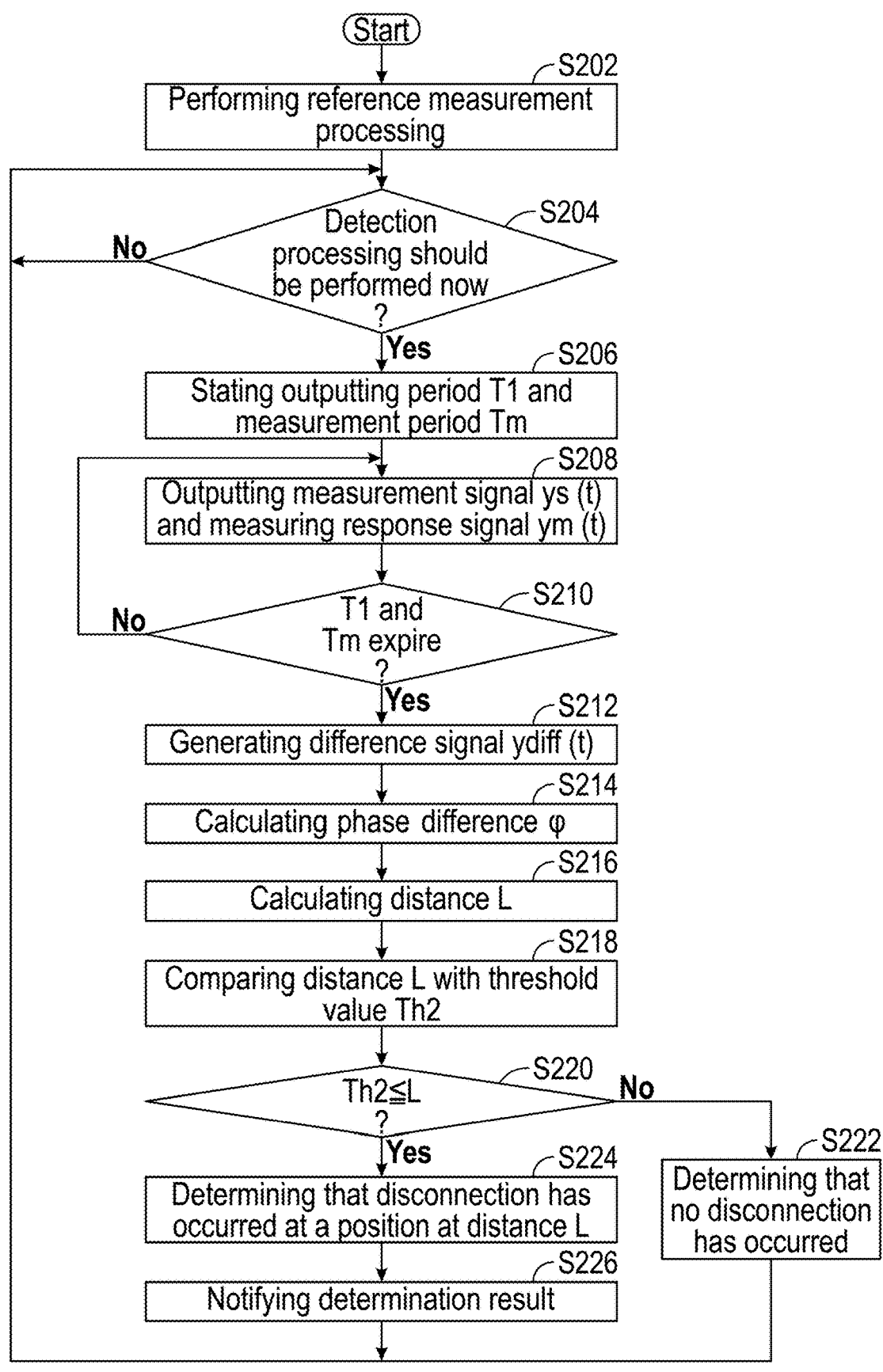
FIG. 9 is a flowchart defining an example of an operation procedure when the relay apparatus according to the second embodiment of the present disclosure performs detection processing.

FIG. 9 is a flowchart defining an example of an operation procedure when the relay apparatus according to the second embodiment of the present disclosure performs a detection processing.

Referring to FIG. 9, first, relay apparatus 102 performs reference measurement processing. More specifically, relay apparatus 102 outputs measurement signal ys (t) to transmission line 1 to be detected, generates digital response signal ymdR (t) that is digital response signal ymd (t) in a steady-state time, and stores digital response signal ymdR (t) in storage unit 15 (step S202).

Next, relay apparatus 102 waits for the timing at which the detection processing should be performed (NO in step S204), and starts outputting period T1 and measurement period Tm (step S206) at the timing at which the detection processing should be performed (YES in step S204).

Next, relay apparatus 102 outputs measurement signal ys (t) to transmission line 1 to be detected in outputting period T1, and measures response signal ym (t) from transmission line 1 to measurement signal ys (t) in measurement period Tm. More specifically, relay apparatus 101 outputs measurement signal ys (t) for one sample to transmission line 1, and samples the voltage level of transmission line 1 to generate digital response signal ymd (t) for one sample (step S208).

Next, relay apparatus 102 alternately repeats outputting measurement signal ys (t) for one sample and generating digital response signal ymd (t) for one sample until outputting period T1 and measurement period Tm expire (NO in step S210), and generates difference signal ydiff (t) that is the difference between response signal ym (t) and digital response signal ymdR (t) when outputting period T1 and measurement period Tm expire (YES in step S210). More specifically, relay apparatus 102 generates difference signal ydiff (t) by subtracting digital response signal ymdR (t) in storage unit 15 from digital response signal ymdS (t) (step S212).

Next, relay apparatus 102 calculates phase difference Φ between digital response signal ymdR (t) and difference signal ydiff (t). More specifically, relay apparatus 102 calculates phase difference Φ using argument θmdR (t) of complex analysis signal CmdR (t) of digital response signal ymdR (t) and argument θdiff (t) of complex analysis signal Cdiff (t) of difference signal ydiff (t) (step S214).

Next, relay apparatus 102 calculates distance L corresponding to phase difference Φ in accordance with the above-described equation (2) (step S216).

Next, relay apparatus 101 compares the calculated distance L with threshold value Th2 (step S218).

Next, when distance L is less than threshold value Th2 (NO in step S220), relay apparatus 102 determines that no disconnection has occurred in transmission line 1 (step S222), and waits for a next timing at which the detection processing should be performed (NO in step S204).

On the other hand, when distance L is equal to or greater than threshold value Th2 (YES in step S220), relay apparatus 102 determines that the disconnection has occurred at a position at distance L from the end portion facing relay apparatus 102 in transmission line 1 (step S224).

Next, relay apparatus 102 notifies the user of the determination result via the communication unit (not shown) and communication apparatus 111 (step S226), and waits for a next timing at which the detection processing should be performed (NO in step S204).

As described above, in relay apparatus 102 according to the second embodiment of the present disclosure, processing unit 24 generates difference signal ydiff (t) that is the difference between response signal ym (t) and digital response signal ymdR (t) that is response signal ym (t) measured by signal measurement unit 23 in a steady-state time.

With such a configuration, compared with relay apparatus 101 according to the first embodiment of the present disclosure, it is possible to calculate difference signal ydiff (t) with reduced noise, and thus it is possible to more accurately detect the disconnection in transmission line 1 using the calculated difference signal ydiff (t). On the other hand, in relay apparatus 101 according to the first embodiment of the present disclosure, it is possible to detect the disconnection in transmission line 1 by a simpler configuration than that of relay apparatus 102.

Next, other embodiments of the present disclosure will be described with reference to the drawings. Note that the same or corresponding parts in the drawings are denoted by the same reference numerals, and description thereof will not be repeated.

Third Embodiment

Compared with relay apparatus 101 according to the first embodiment, the present embodiment relates to a relay apparatus 103 that performs detection processing using digital measurement signal ysd (t) obtained by performing delay adjustment on measurement signal ys (t) to be output to transmission line 1. Relay apparatus 103 is the same as relay apparatus 101 according to the first embodiment except for the contents described below.

Figure 10:
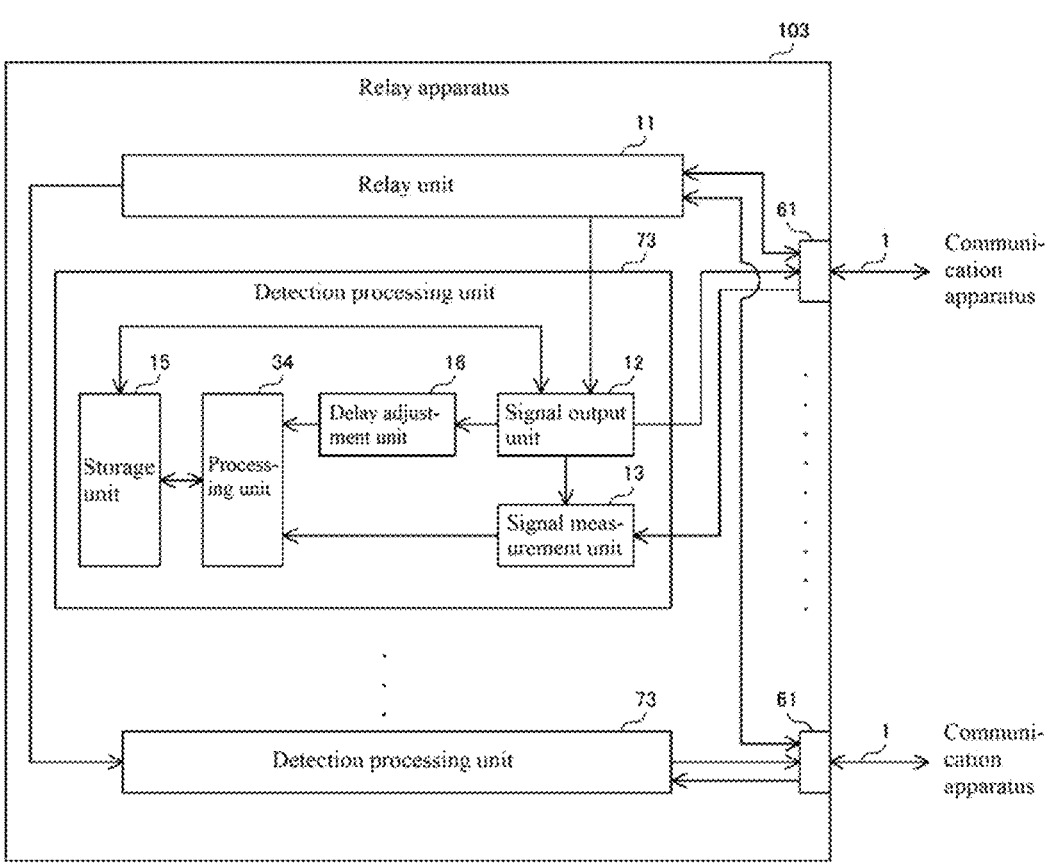
FIG. 10 is a diagram showing a configuration of a relay apparatus according to a third embodiment of the present disclosure.

FIG. 10 is a diagram showing a configuration of a relay apparatus according to the third embodiment of the present disclosure. Referring to FIG. 10, relay apparatus 103 includes a detection processing unit 73 instead of detection processing unit 71, as compared with relay apparatus 101 according to the first embodiment. Detection processing unit 73 includes a processing unit 34 instead of processing unit 14 and further includes a delay adjustment unit 16, as compared with detection processing unit 71.

Signal output unit 12 outputs the synchronization signal to signal measurement unit 13, and outputs measurement signal ys (t) to transmission line 1 to be detected in outputting period T1. Signal output unit 12 obtains digital data Dt from storage unit 15 at the outputting timing according to cycle C1, and outputs the obtained digital data Dt to delay adjustment unit 16 as digital measurement signal ysd (t).

When receiving the synchronization signal from signal output unit 12, signal measurement unit 13 starts measurement period Tm, generates digital response signal ymd (t) by sampling the voltage level of transmission line 1 by the ADC at the sampling timing according to cycle C1 in measurement period Tm, and outputs the generated digital response signal ymd (t) to processing unit 34.

Delay adjustment unit 16 receives digital measurement signal ysd (t) from signal output unit 12, delays the received digital measurement signal ysd (t), and outputs the delayed digital measurement signal ysd (t) to processing unit 34. More specifically, delay adjustment unit 16 outputs a digital measurement signal ysdD (t) whose phase is delayed with respect to measurement signal ys (t) to be output to transmission line 1 by signal output unit 12 to processing unit 34.

For example, in relay apparatus 103, the delay amount of digital measurement signal ysdD (t) to measurement signal ys (t) can be set and changed. More specifically, delay time dt of digital measurement signal ysdD (t) to be output by delay adjustment unit 16 to processing unit 34 can be set and changed. For example, the user sets delay time dt in delay adjustment unit 16 such that the amplitude of difference signal ydiff (t) generated by processing unit 34 in the initial state is less than a predetermined value.

Delay adjustment unit 16 receives the setting of delay time dt. In the detection processing, delay adjustment unit 16 delays digital measurement signal ysd (t) received from signal output unit 12 by delay time dt and outputs the delayed signal to processing unit 34.

Processing unit 34 generates difference signal ydiff (t) that is a difference between response signal ym (t) and digital measurement signal ysdD (t) that is a signal obtained by performing delay adjustment on measurement signal ys (t). More specifically, processing unit 34 generates difference signal ydiff (t) by subtracting digital measurement signal ysdD (t) received from delay adjustment unit 16 from digital response signal ymd (t) received from signal measurement unit 13.

Processing unit 34 calculates complex analysis signal Csd (t) by performing the Hilbert transform on digital measurement signal ysdD (t) received from delay adjustment unit 16. Further, processing unit 34 calculates complex analysis signal Cdiff (t) by performing the Hilbert transform on the generated difference signal ydiff (t). Then, processing unit 34 calculates the difference between argument θsd (t) of complex analysis signal Csd (t) and argument θdiff (t) of complex analysis signal Cdiff (t) as phase difference Φ.

After calculating phase difference Φ, processing unit 34 calculates distance L corresponding to the calculated phase difference Φ in accordance with the above-described equation (2).

Processing unit 34 determines whether or not the disconnection has occurred in transmission line 1 based on the calculated distance L. When the disconnection occurs in transmission line 1, processing unit 34 further detects the position of occurrence of the disconnection in transmission line 1.

For example, processing unit 34 compares the calculated distance L with the predetermined threshold value Th2, and determines whether or not the disconnection has occurred in transmission line 1 based on the comparison result. More specifically, when the calculated distance L is less than threshold value Th2, processing unit 34 determines that no disconnection has occurred in transmission line 1. On the other hand, when the calculated distance L is equal to or greater than threshold value Th2, processing unit 34 determines that the disconnection has occurred at the position of distance L from the end portion facing relay apparatus 103 in transmission line 1.

Figure 11:
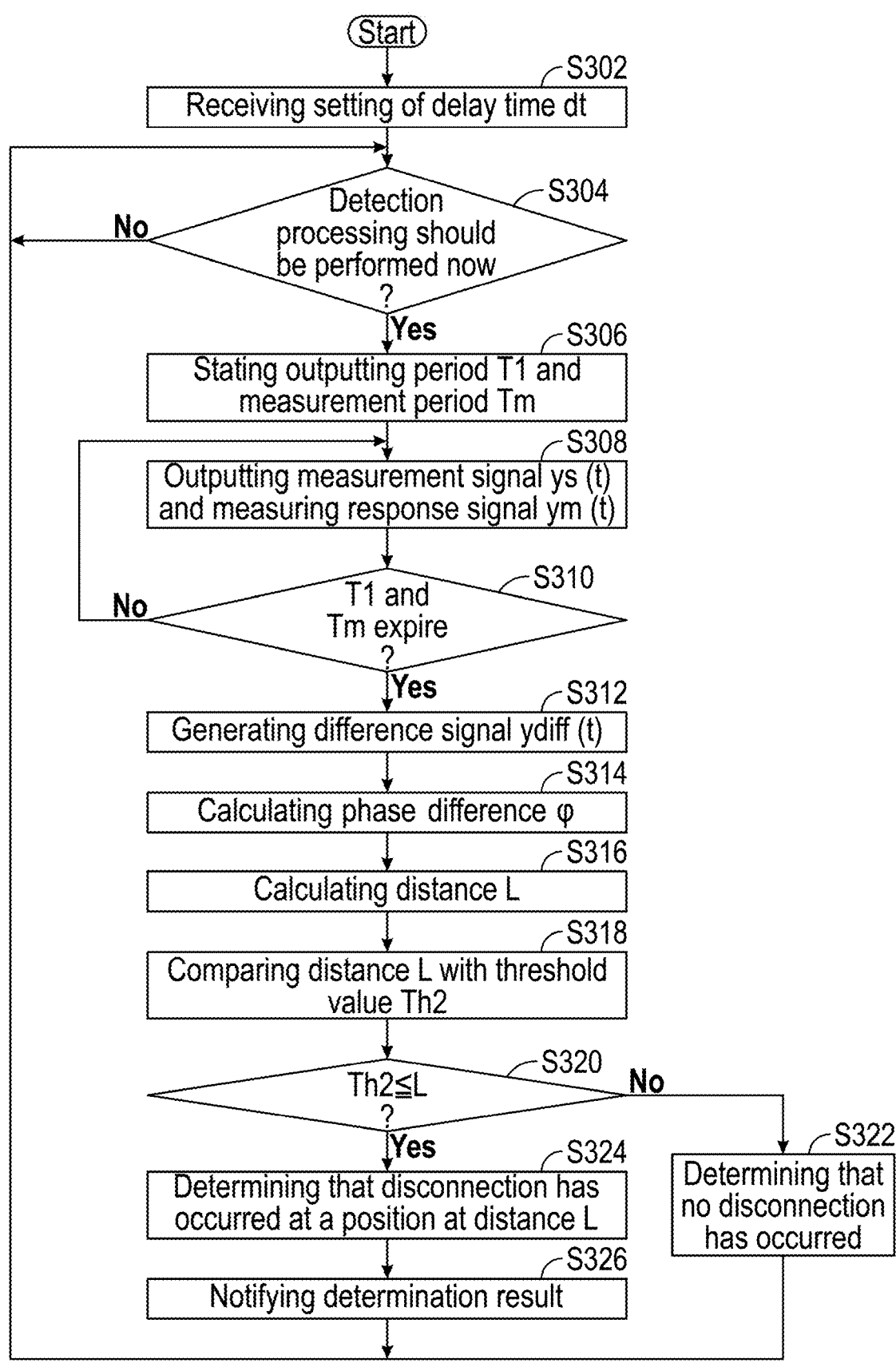
FIG. 11 is a flowchart defining an example of an operation procedure when the relay apparatus according to the third embodiment of the present disclosure performs detection processing.

FIG. 11 is a flowchart defining an example of an operation procedure when the relay apparatus according to the third embodiment of the present disclosure performs detection processing.

Referring to FIG. 11, first, relay apparatus 103 receives setting of delay time dt (step S302).

Next, relay apparatus 103 performs processing similar to that from step S102 to step S114 in FIG. 7 as processing from step S304 to step S316, and performs processing similar to that from step S218 to step S226 in FIG. 9 as processing from step S318 to step S326.

Relay apparatus 103 according to the third embodiment of the present disclosure has a configuration in which delay time dt of digital measurement signal ysd (t) can be set and changed in delay adjustment unit 16, but is not limited thereto. Delay time dt of digital measurement signal ysd (t) in delay adjustment unit 16 may be a predetermined value, for example, according to the length of transmission line 1 such that the amplitude of difference signal ydiff (t) generated by processing unit 34 is less than the predetermined value.

Next, other embodiments of the present disclosure will be described with reference to the drawings. Note that the same or corresponding parts in the drawings are denoted by the same reference numerals, and description thereof will not be repeated.

Fourth Embodiment

Compared with relay apparatus 101 according to the first embodiment, the present embodiment relates to a relay apparatus 104 that calculates phase difference Φ by correlation detection. Relay apparatus 104 is the same as relay apparatus 101 according to the first embodiment except for the contents described below.

Figure 12:
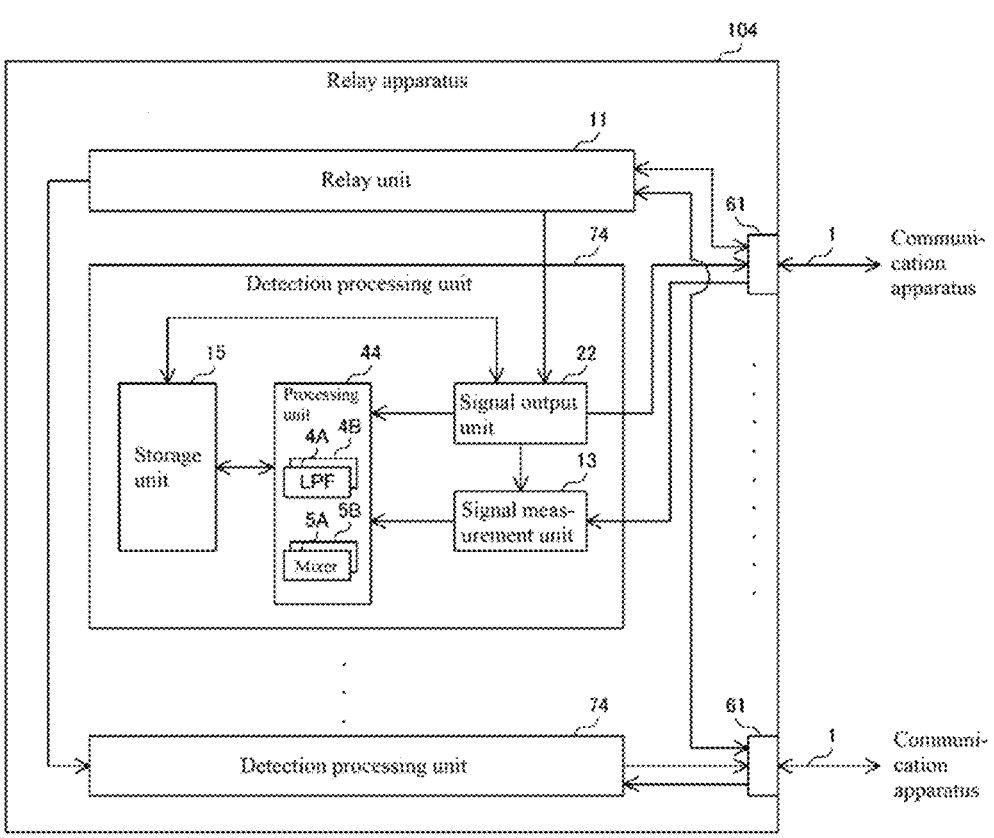
FIG. 12 is a diagram showing a configuration of a relay apparatus according to a fourth embodiment of the present disclosure.

FIG. 12 is a diagram showing a configuration of a relay apparatus according to a fourth embodiment of the present disclosure. Referring to FIG. 12, relay apparatus 104 includes a detection processing unit 74 instead of detection processing unit 71, as compared with relay apparatus 101 according to the first embodiment. Detection processing unit 74 includes a signal output unit 22 instead of signal output unit 12 and a processing unit 44 instead of processing unit 14, as compared with detection processing unit 71. Processing unit 44 includes LPFs 4A and 4B and mixers 5A and 5B.

Signal output unit 22 outputs the measurement signal that is a sine wave, to transmission line 1. More specifically, signal output unit 22 outputs the synchronization signal to signal measurement unit 13, and outputs measurement signal ys (t) to transmission line 1 to be detected in outputting period T1. More specifically, signal output unit 22 obtains digital data Dt from storage unit 15 at the outputting timing according to cycle C1, and outputs measurement signal ys (t) generated by converting the obtained digital data Dt into an analog signal by the DAC to transmission line 1 to be detected.

Further, signal output unit 22 outputs digital data Dt obtained from storage unit 15 to processing unit 44 as digital measurement signal ysd (t). Signal output unit 22 further outputs a digital measurement signal ysdP (t) that is a signal obtained by shifting the phase of the component of frequency f included in digital measurement signal ysd (t) by π/2 to processing unit 44 with reference to the frequency-information in storage unit 15.

When receiving the synchronization signal from signal output unit 22, signal measurement unit 13 starts measurement period Tm, generates digital response signal ymd (t) by sampling the voltage level of transmission line 1 at a sampling frequency fs by the ADC in measurement period Tm, and outputs the generated digital response signal ymd (t) to processing unit 44. Here, sampling frequency fs is the reciprocal of cycle C1.

Processing unit 44 generates difference signal ydiff (t) by subtracting digital measurement signal ysd (t) received from signal output unit 22 from digital response signal ymd (t) received from signal measurement unit 13.

Then, processing unit 44 calculates phase difference Φ using the output signal output from LPF 4A by inputting a multiplication signal Ms1 (t) of digital measurement signal ysd (t) and difference signal ydiff (t) to LPF (low pass filter) 4A and the output signal output from LPF 4A by inputting a multiplication signal Ms2 (*t*) of digital measurement signal ysdP (t) and difference signal ydiff (t) to LPF 4B. LPF 4A is an example of a first filter. LPF 4B is an example of a second filter.

More specifically, processing unit 44 generates multiplication signal Ms1 (*t*) by multiplying digital measurement signal ysd (t) and difference signal ydiff (t) using mixer 5A, and generates multiplication signal Ms2 (*t*) by multiplying digital measurement signal ysdP (t) and difference signal ydiff (t) using mixer 5B.

Figure 13:
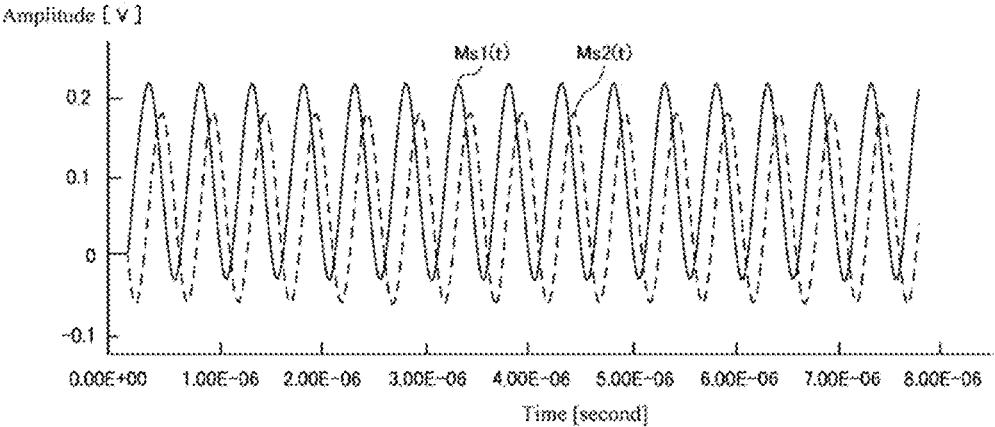
FIG. 13 is a diagram showing a simulation result of a multiplication signal generated by a processing unit in the relay apparatus according to the fourth embodiment of the present disclosure.

FIG. 13 is a diagram showing a simulation result of a multiplication signal generated by the processing unit in the relay apparatus according to the fourth embodiment of the present disclosure. In FIG. 13, the horizontal axis represents time [second] and the vertical axis represents amplitude [V] of the signal. The solid line in FIG. 13 represents multiplication signal Ms1 (*t*), and the dashed line in FIG. 13 represents multiplication signal Ms2 (*t*). FIG. 13 shows simulation results of multiplication signals Ms1 (*t*) and Ms2 (*t*) calculated by processing unit 44 in the case where the disconnection occurs at a position 10 m away from the end portion facing relay apparatus 104 in transmission line 1 having a length of 11 m.

When digital measurement signal ysd (t) is a cosine wave, multiplication signals Ms1 (*t*) and Ms2 (*t*) are expressed by the following equations (4) and (5).

[Equation 4]

$$Ms1(t) = \frac{A1 \times A2}{2} \{\cos(2\omega t + \varphi) + \cos\varphi\} \tag{4}$$

[Equation 5]

$$Ms2(t) = \frac{A1 \times A2}{2} \{\sin(2\omega t + \varphi) + \sin\varphi\} \tag{5}$$

Here, A1 is the amplitude of measurement signal ys (t), A2 is the amplitude of reflection signal yr (t), and ω is an angular frequency corresponding to frequency f. As shown in equations (4) and (5), multiplication signals Ms1 (*t*) and Ms2 (*t*) include a frequency-component Fc that is twice frequency f of measurement signal ys (t) and a direct-current component Dc that is a constant term.

Processing unit 44 attenuates frequency-component Fc of multiplication signals Ms1 (*t*) and Ms2 (*t*) using LPFs 4A and 4B described above to generate extraction signals MsD1 (*t*) and MsD2 (*t*) that are signals obtained by extracting direct-current component Dc of multiplication signals Ms1 (*t*) and Ms2 (*t*). The cut-off frequencies of LPFs 4A and 4B are, for example, equal to or lower than twice frequency f. LPFs 4A and 4B attenuate a frequency-component based on frequency f of measurement signal ys (t).

For example, processing unit 44 uses an average value filter as LPFs 4A and 4B. The first average value filter receives multiplication signal Ms1 (*t*) and outputs extraction signal MsD1 (*t*) that is an average value of multiplication signal Ms1 (*t*) for each sample number N. The second average value filter receives multiplication signal Ms2 (*t*) and outputs extraction signal MsD2 (*t*) that is an average value of multiplication signal Ms2 (*t*) for each sample number N. Here, N is a natural number. For example, sample number N, sampling frequency fs, and frequency f satisfy the following equation (6).

[Equation 6]

$$fs = N \times f \tag{6}$$

As a result, the positive and negative values of multiplication signal Ms1 (*t*) cancel each other by the first average value filter, and extraction signal MsD1 (*t*), in which frequency-component Fc of multiplication signal Ms1 (*t*) is attenuated, is obtained. Further, the positive and negative values of multiplication signal Ms2 (*t*) cancel each other by the second average value filter, and extraction signal MsD2 (*t*), in which frequency-component Fc of multiplication signal Ms2 (*t*) is attenuated, is obtained.

Sample number N, sampling frequency fs, and frequency f may be values that satisfy the following equation (7). Thus, the ADC that performs sampling at the lower sampling frequency fs can be used as the ADC for generating digital response signal ymd (t).

[Equation 7]

$$fs = \frac{f}{N} \tag{7}$$

Figure 14:
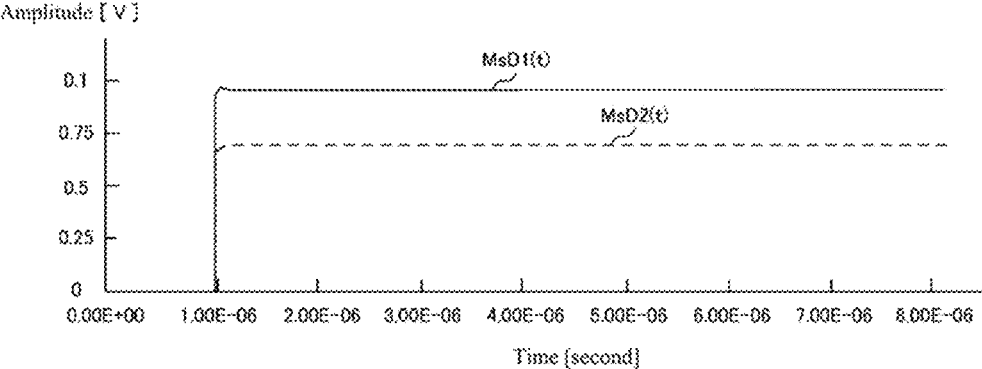
FIG. 14 is a diagram showing a simulation result of an extraction signal generated by the processing unit in the relay apparatus according to a fourth embodiment of the present disclosure.

FIG. 14 is a diagram showing a simulation result of an extraction signal generated by the processing unit in the relay apparatus according to the fourth embodiment of the present disclosure. In FIG. 14, the horizontal axis represents time [second] and the vertical axis represents amplitude [V] of the signal. The solid line in FIG. 14 represents extraction signal MsD1 (*t*), and the dashed line in FIG. 14 represents extraction signal MsD2 (*t*). FIG. 14 shows simulation results of extraction signals MsD1 (*t*) and MsD2 (*t*) calculated by processing unit 44 in the case where the disconnection occurs at a position 10 m away from the end portion facing relay apparatus 104 in transmission line 1 having a length of 11 m, similarly to FIG. 13.

Extraction signal MsD1 (*t*) that is an output signal of the first average value filter and extraction signal MsD2 (*t*) that is an output signal of the second average value filter are expressed by the following equations (8) and (9).

[Equation 8]

$$MsD1(t) = \frac{A1 \times A2}{2} \times \cos\varphi \tag{8}$$

[Equation 9]

$$MsD2(t) = \frac{A1 \times A2}{2} \times \sin\varphi \tag{9}$$

Processing unit 44 calculates phase difference Φ using extraction signals MsD1 (*t*) and MsD2 (*t*) in accordance with the following equation (10).

[Equation 10]

$$\varphi = \tan^{-1}\left\{\frac{MsD2(t)}{MsD1(t)}\right\} \tag{10}$$

After calculating phase difference Φ, processing unit 44 calculates distance L corresponding to the calculated phase difference Φ in accordance with the above-described equation (2).

Figure 15:
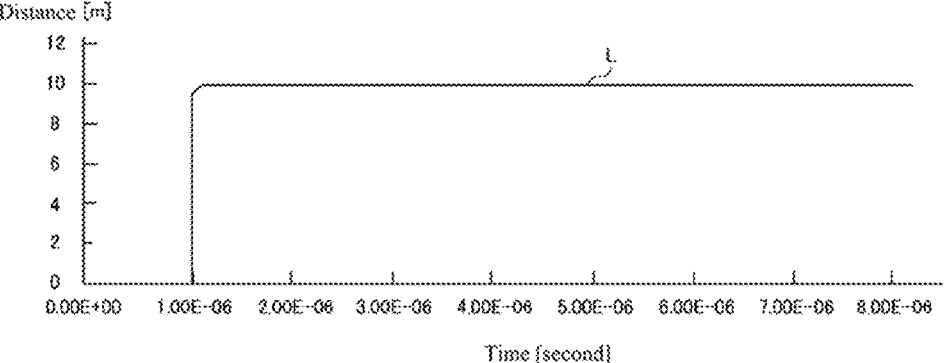
FIG. 15 is a diagram showing a simulation result of a distance calculated by the processing unit in the relay apparatus according to the fourth embodiment of the present disclosure.

FIG. 15 is a diagram showing a simulation result of a distance calculated by the processing unit in the relay apparatus according to the fourth embodiment of the present disclosure. In FIG. 15, the horizontal axis represents time [second], and the vertical axis represents the distance [m] from the end portion facing relay apparatus 104 in transmission line 1 to the reflection point. FIG. 15 shows a simulation result of distance L calculated by processing unit 44 when the disconnection occurs at a position 10 m away from the end portion facing relay apparatus 104 in transmission line 1 having a length of 11 m, similarly to FIGS. 13 and 14.

Referring to FIG. 15, distance L calculated by processing unit 44 substantially coincides with 10 m that is the distance between the end portion facing relay apparatus 104 and the disconnection position. As described above, by the detection method according to the present embodiment, it is possible to detect whether or not the disconnection has occurred in transmission line 1 and the position of occurrence of the disconnection.

After calculating distance L, processing unit 44 determines whether or not the disconnection has occurred in transmission line 1 based on the calculated distance L. When the disconnection occurs in transmission line 1, processing unit 44 further detects the position of occurrence of the disconnection in transmission line 1. The method of determining whether or not the disconnection has occurred in transmission line 1 and the method of detecting the position where the disconnection has occurred are as described in the first embodiment.

Figure 16:
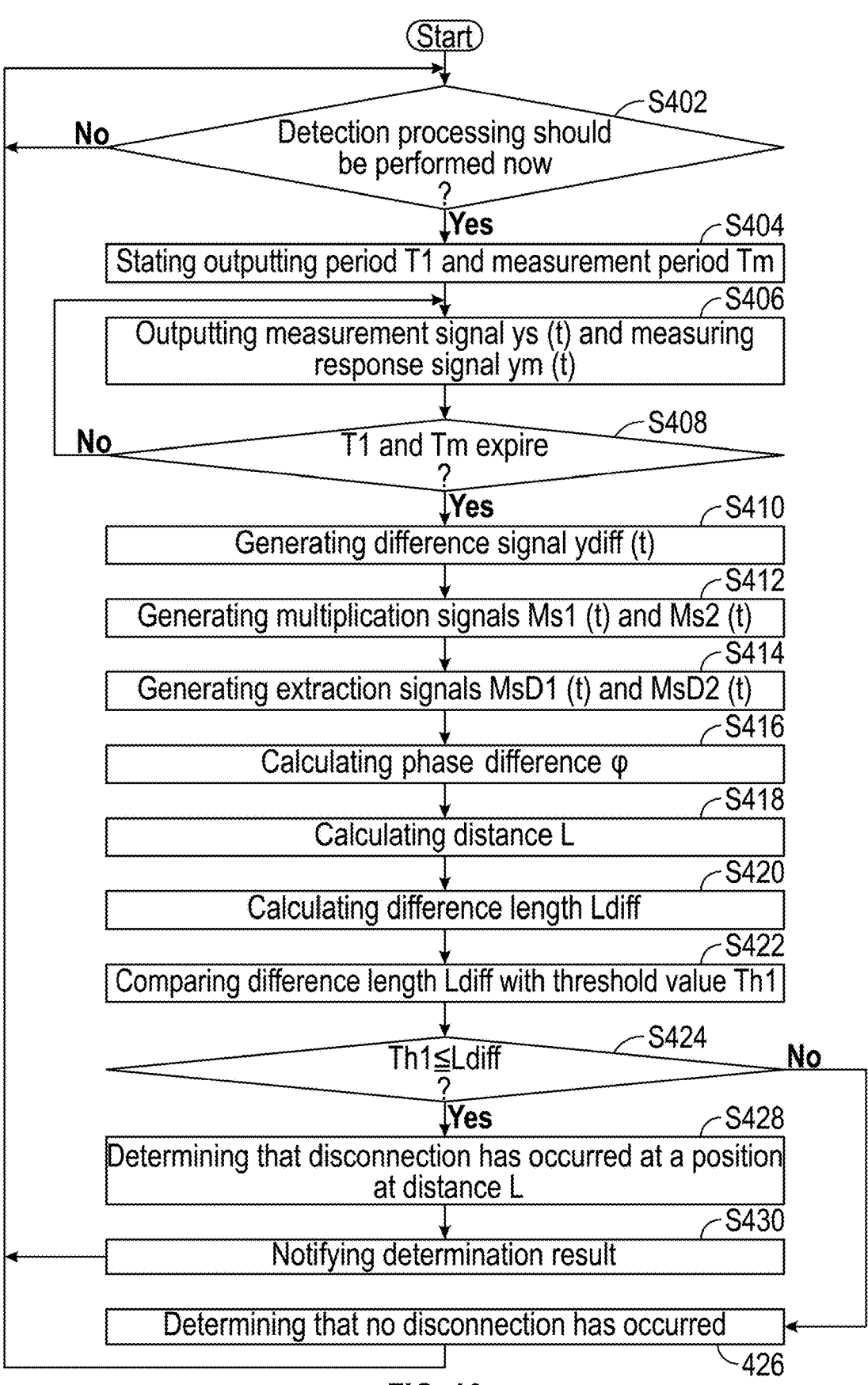
FIG. 16 is a flowchart defining an example of an operation procedure when the relay apparatus according to the fourth embodiment of the present disclosure performs detection processing.

FIG. 16 is a flowchart defining an example of an operation procedure when the relay apparatus according to the fourth embodiment of the present disclosure performs detection processing.

Referring to FIG. 16, first, relay apparatus 104 performs processing similar to that from step S102 to step S110 in FIG. 7 as processing from step S402 to step S410.

Next, relay apparatus 104 generates multiplication signal Ms1 ($t$) by multiplying digital measurement signal ysd ($t$) and difference signal ydiff ($t$) using mixer 5A, and generates multiplication signal Ms2 ($t$) by multiplying digital measurement signal ysdP (t) and difference signal ydiff ($t$) using mixer 5B (step S412).

Next, relay apparatus 104 generates extraction signals MsD1 (t) and MsD2 ($t$) by attenuating frequency-component Fc of multiplication signals Ms1 ($t$) and Ms2 ($t$) using the average value filter (step S414).

Next, relay apparatus 104 calculates phase difference Φ using extraction signals MsD1 ($t$) and MsD2 ($t$) in accordance with the above-described equation (10) (step S416).

Next, relay apparatus 104 performs processing similar to that from step S114 to step S126 in FIG. 7 as processing from step S418 to step S430.

In relay apparatus 104 according to the fourth embodiment of the present disclosure, processing unit 44 calculates phase difference Ø using the output signal output from LPF 4A by inputting multiplication signal Ms1 ($t$) to LPF 4A and the output signal output from LPF 4B by inputting multiplication signal Ms2 ($t$) to LPF 4B, but is not limited thereto. For example, processing unit 44 may be configured to use a BPF for extracting a direct-current component instead of LPFs 4A and 4B. Further, for example, signal measurement unit 13 generates digital response signal ymd (t) by sampling and holding the voltage level of transmission line 1 at frequency f of measurement signal ys (t), and outputs the generated digital response signal ymd (t) to processing unit 44. In this case, processing unit 44 may be configured to calculate phase difference Φ using multiplication signals Ms1 ($t$) and Ms2 ($t$) without using LPFs 4A and 4B.

In relay apparatus 104 according to the fourth embodiment of the present disclosure, signal output unit 22 is configured to output the measurement signal that is a sine wave to transmission line 1, but is not limited thereto. Signal output unit 22 may be configured to output a measurement signal having a plurality of frequency components to transmission line 1, or may be configured to output a measurement signal that is a rectangular wave to transmission line 1. More specifically, signal output unit 22 obtains digital data DtRW including a plurality of values indicating a waveform of a rectangular wave from storage unit 15, and outputs a signal obtained by converting the obtained digital data DtRW into an analog signal as measurement signal ys (t) to transmission line 1 to be detected. Signal output unit 22 outputs digital data DtRW obtained from storage unit 15 to processing unit 44 as a digital measurement signal ysdRW (t). Signal output unit 22 further outputs a digital measurement signal ysdRWP (t) that is a signal obtained by shifting the phase of digital measurement signal ysdRW (t) by π/2 to processing unit 44.

Signal measurement unit 13 generates a digital response signal ymdRW (t) by sampling the voltage level of transmission line 1 by the ADC at sampling frequency fs, and outputs generated digital response signal ymdRW (t) to processing unit 44.

Processing unit 44 generates a difference signal ydiffR (t) by subtracting digital measurement signal ysdRW (t) received from signal output unit 22 from digital response signal ymdRW (t) received from signal measurement unit 13. Processing unit 44 extracts a signal with a part of the frequency components from digital measurement signal ysdRW (t) using the BPF, and generate multiplication signal Ms1 (t) by multiplying the extracted signal by difference signal ydiffR (t). In addition, processing unit 44 extracts a signal with a part of the frequency components from digital measurement signal ysdRWP (t) using the BPF, and generates multiplication signal Ms2 ($t$) by multiplying the extracted signal by difference signal ydiffR (t). Processing unit 44 uses LPFs 4A and 4B to generate extraction signals MsD1 (t) and MsD2 ($t$) that are signals obtained by extracting direct-current component Dc of multiplication signals Ms1 (t) and Ms2 ($t$) and uses the generated extraction signals MsD1 ($t$) and MsD2 ($t$) to calculate phase difference Φ according to the above-described equation (10). In processing unit 44, since the frequency component to be extracted using the BPF can be arbitrarily set, it is possible to perform the detection processing by focusing on an arbitrary frequency component included in the measurement signal that is a rectangular wave.

In relay apparatus 104 according to the fourth embodiment of the present disclosure, since phase difference Φ can be calculated by correlation detection, noise resistance can be improved as compared with relay apparatus 101 according to the first embodiment. Therefore, an abnormality in transmission line 1 can be detected more accurately. In addition, in relay apparatus 104, since it is not necessary to calculate the complex analysis signal as compared with relay apparatus 101, the implementation cost can be reduced. On the other hand, in relay apparatus 101, since the time required for calculating phase difference Φ can be shortened compared to relay apparatus 104, it is possible to determine the presence or absence of an abnormality at an earlier stage. (Modification)

Processing unit 44 may be configured to calculate phase difference Φ by correlation detection using a rectangular wave digital signal.

Signal output unit 22 obtains digital data DtRW composed of a plurality of values indicating a waveform of a rectangular wave from storage unit 15 at an outputting timing according to cycle C1, and outputs measurement signal ys (t) that is a sine wave extracted from an analog signal obtained by converting the obtained digital data DtRW into an analog signal using the BPF to transmission line 1 to be detected.

Signal output unit 22 also outputs digital data DtRW obtained from storage unit 15 to processing unit 44 as digital measurement signal ysdRW (t). Digital measurement signal ysdRWP (t) that is a signal obtained by shifting the phase of digital measurement signal ysdRW (t) by π/2 is further output to processing unit 44.

Processing unit 44 generates difference signal ydiffR (t) by subtracting digital measurement signal ysdRW (t) received from signal output unit 22 from digital response signal ymd (t) received from signal measurement unit 13.

Processing unit 44 calculates phase difference Φ using the output signal output from LPF 4A by inputting multiplication signal Ms1 (*t*) of digital measurement signal ysdRW (t) and difference signal ydiffR (t) to LPF 4A and the output signal output from LPF 4B by inputting multiplication signal Ms2 (*t*) of digital measurement signal ysdRWP (t) and difference signal ydiffR (t) to LPF 4B.

More specifically, processing unit 44 generates multiplication signal Ms1 (t) by multiplying digital measurement signal ysdRW (t) and difference signal ydiffR (t), and generates multiplication signal Ms2 (*t*) by multiplying digital measurement signal ysdRWP (t) and difference signal ydiffR (t). In this case, since the multiplication of digital measurement signal ysdRW (t) and difference signal ydiffR (t), and the multiplication of digital measurement signal ysdRWP (t) and difference signal ydiffR (t) can be achieved by periodically repeating inversion and non-inversion of the original waveform, it is not necessary to use a complicated multiplier for generating multiplication signals Ms1 (*t*) and Ms2 (*t*), and the hardware can be simplified and the cost can be reduced.

Figure 17:
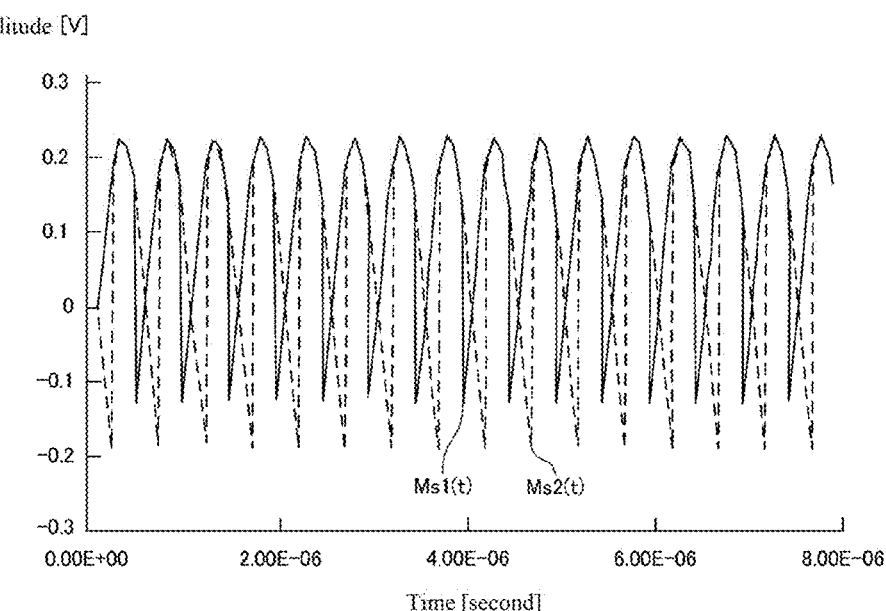
FIG. 17 is a diagram showing a simulation result of a multiplication signal generated by a processing unit in a relay apparatus according to a modification of the fourth embodiment of the present disclosure.

FIG. 17 is a diagram showing a simulation result of the multiplication signal generated by a processing unit in a relay apparatus according to a modification of the present disclosure. In FIG. 17, the horizontal axis represents time [second] and the vertical axis represents amplitude [V] of the signal. The solid line in FIG. 17 represents multiplication signal Ms1 (*t*), and the dashed line in FIG. 17 represents multiplication signal Ms2 (*t*). FIG. 17 shows simulation results of multiplication signals Ms1 (*t*) and Ms2 (*t*) calculated by processing unit 44 in the case where the disconnection occurs at a position 10 m away by from the end portion facing relay apparatus 104 in transmission line 1 having a length of 11 m.

Processing unit 44 attenuates frequency-component Fc of multiplication signals Ms1 (*t*) and Ms2 (*t*) using the average value filter to generate extraction signals MsDR1 (*t*) and MsDR2 (*t*) that are signals obtained by extracting direct-current component Dc of multiplication signals Ms1 (*t*) and Ms2 (*t*).

Figure 18:
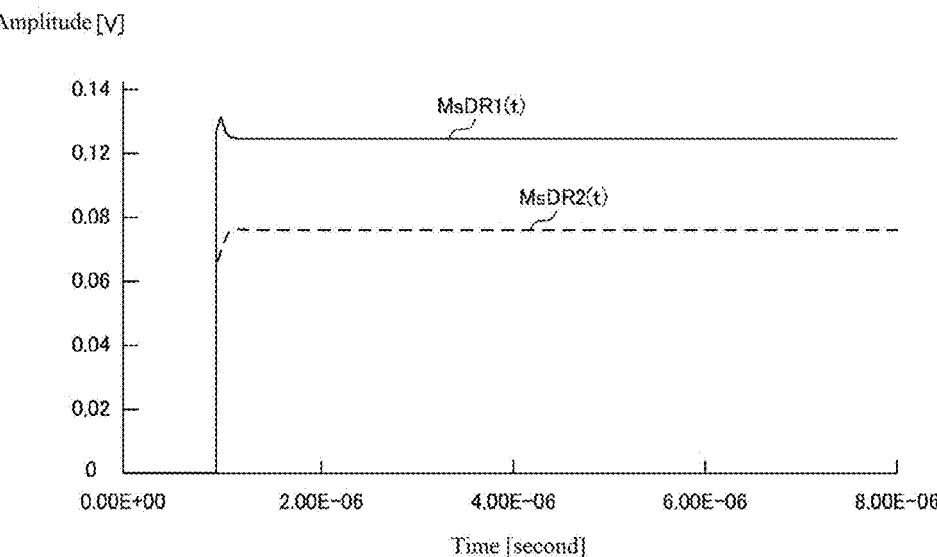
FIG. 18 is a diagram showing a simulation result of an extraction signal generated by the processing unit in the relay apparatus according to the modification of the fourth embodiment of the present disclosure.

FIG. 18 is a diagram showing a simulation result of an extraction signal generated by the processing unit in the relay apparatus according to the modification of the fourth embodiment of the present disclosure. In FIG. 18, the horizontal axis represents time [second] and the vertical axis represents amplitude [V] of the signal. The solid line in FIG. 18 represents extraction signal MsDR1 (*t*) and the dashed line in FIG. 18 represents extraction signal MsDR2 (*t*). FIG. 18 shows simulation results of extraction signals MsDR1 (*t*) and MsDR2 (*t*) calculated by processing unit 44 in the case where the disconnection occurs at a position 10 m away from the end portion facing relay apparatus 104 in transmission line 1 having a length of 11 m, similarly to FIG. 17.

Processing unit 44 calculates phase difference Φ by using extraction signals MsDR1 (*t*) and MsDR2 (*t*) instead of extraction signals MsD1 (*t*) and MsD2 (*t*) according to the above-described equation (10).

After calculating phase difference Φ, processing unit 44 calculates distance L corresponding to the calculated phase difference Φ in accordance with the above-described equation (2).

Figure 19:
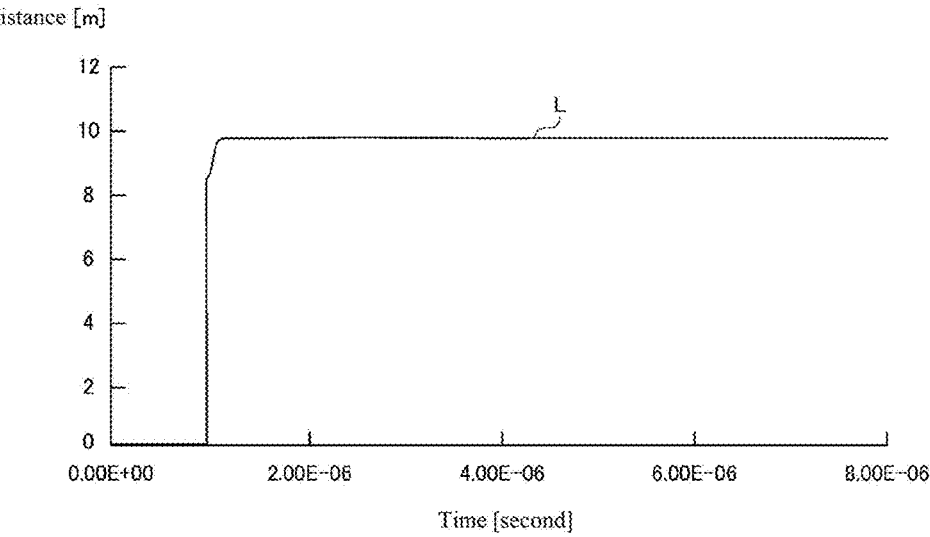
FIG. 19 is a diagram showing a simulation result of a distance calculated by the processing unit in the relay apparatus according to the modification of the fourth embodiment of the present disclosure.

FIG. 19 is a diagram showing a simulation result of a distance calculated by the processing unit in the relay apparatus according to the modification of the fourth embodiment of the present disclosure. In FIG. 19, the horizontal axis represents time [second], and the vertical axis represents the distance [m] from the end portion facing relay apparatus 104 in transmission line 1 to the reflection point. FIG. 19 shows a simulation result of distance L calculated by processing unit 44 when the disconnection occurs at a position 10 m away from the end portion facing relay apparatus 104 in transmission line 1 having a length of 11 m, similarly to FIGS. 17 and 18.

Referring to FIG. 19, distance L calculated by processing unit 44 substantially coincides with 10 m that is the distance between the end portion facing relay apparatus 104 and the position of the disconnection. As described above, by the detection method according to this modification, it is possible to detect whether or not the disconnection has occurred in transmission line 1 and the position of occurrence of the disconnection.

After calculating distance L, processing unit 44 determines whether or not the disconnection has occurred in transmission line 1 based on the calculated distance L. When the disconnection occurs in transmission line 1, processing unit 44 further detects the position of occurrence of the disconnection in transmission line 1. The method of determining whether or not the disconnection has occurred in transmission line 1 and the method of detecting the position where the disconnection has occurred are as described in the first embodiment.

Next, other embodiments of the present disclosure will be described with reference to the drawings. Note that the same or corresponding parts in the drawings are denoted by the same reference numerals, and description thereof will not be repeated.

Fifth Embodiment

Compared with relay apparatus 104 according to the fourth embodiment, the present embodiment relates to a relay apparatus 105 that calculates a reflection coefficient rc by correlation detection. Relay apparatus 105 is the same as relay apparatus 104 according to the fourth embodiment except for the contents described below.

Figure 20:
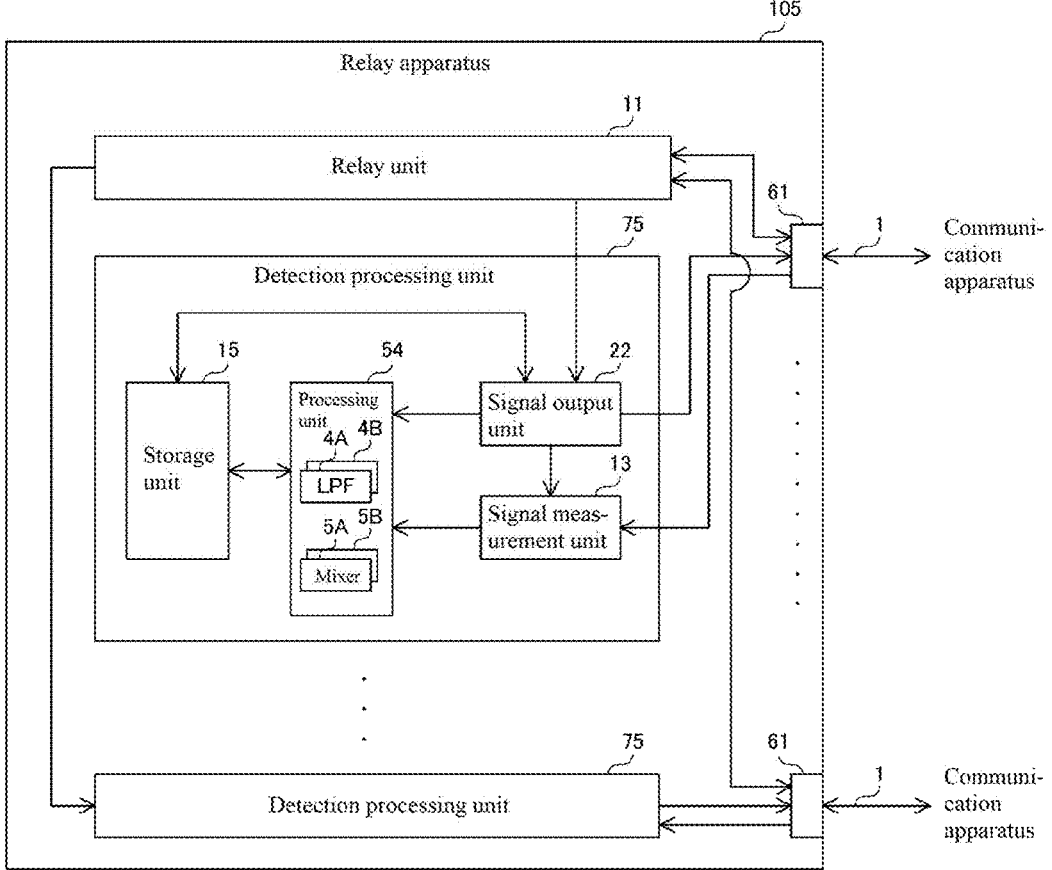
FIG. 20 is a diagram showing a configuration of a relay apparatus according to a fifth embodiment of the present disclosure.

FIG. 20 is a diagram showing a configuration of a relay apparatus according to a fifth embodiment of the present disclosure. Referring to FIG. 20, relay apparatus 105 includes a detection processing unit 75 instead of detection processing unit 74, as compared with relay apparatus 104 according to the fourth embodiment. Compared to detection processing unit 74, detection processing unit 75 includes a processing unit 54 instead of processing unit 44. Processing unit 54 includes LPFs 4A and 4B and mixers 5A and 5B.

Processing unit 54 calculates reflection coefficient rc between digital measurement signal ysd (t) and difference signal ydiff (t) using the output signal output from LPF 4A by inputting multiplication signal Ms1 (*t*) of digital measurement signal ysd (t) and difference signal ydiff (t) to LPF 4A and the output signal output from LPF 4B by inputting multiplication signal Ms2 (*t*) of digital measurement signal ysdP (t) and difference signal ydiff (t) to LPF 4B. Reflection coefficient rc is an example of an index value indicating a strength of correlation between digital measurement signal ysd (t) and difference signal ydiff (t).

More specifically, processing unit 54 generates multiplication signal Ms1 (*t*) by multiplying digital measurement signal ysd (t) and difference signal ydiff (t) using mixer 5A, and generates multiplication signal Ms2 (*t*) by multiplying digital measurement signal ysdP (t) and difference signal ydiff (t) using mixer 5B.

Processing unit 54 attenuates frequency-component Fc of multiplication signals Ms1 (*t*) and Ms2 (*t*) using LPFs 4A and 4B to generate extraction signals MsD1 (*t*) and MsD2 (*t*)

that are signals obtained by extracting direct-current component Dc of multiplication signals Ms1 (t) and Ms2 (t).

Processing unit 54 calculates amplitude A2 of reflection signal yr (t) in accordance with the following equation (11) using the known amplitude A1 of measurement signal ys (t) and the generated extraction signals MsD1 (t) and MsD2 (t).

[Equation 11]

$$A2 = \frac{2 \times \sqrt{MsD1(t)^2 + MsD2(t)^2}}{A1} \qquad (11)$$

Figure 21:
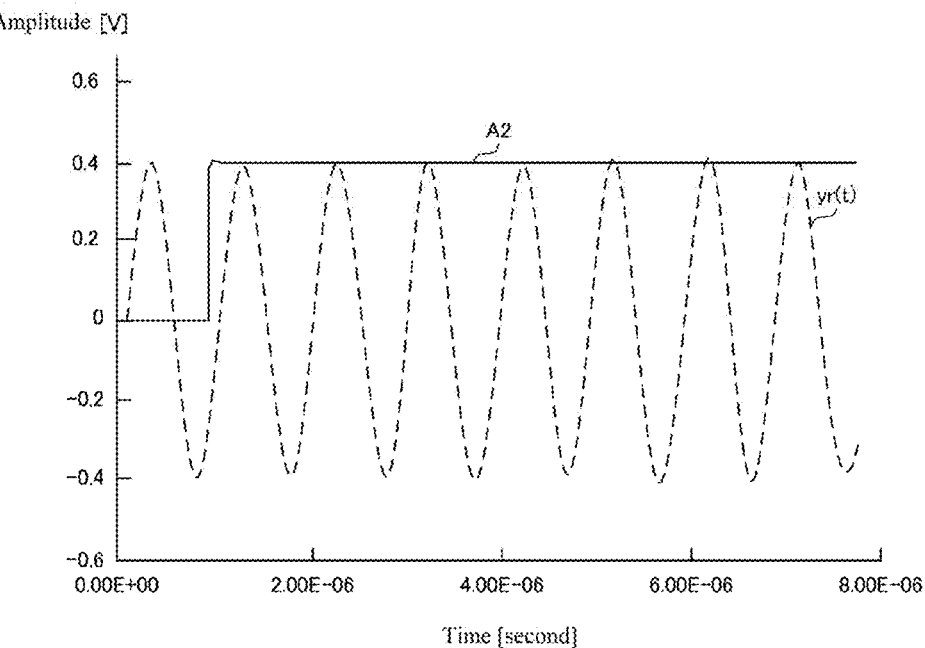
FIG. 21 is a diagram showing a simulation result of an amplitude generated by a processing unit in the relay apparatus according to the fifth embodiment of the present disclosure.

FIG. 21 is a diagram showing a simulation result of an amplitude generated by the processing unit in the relay apparatus according to the fifth embodiment of the present disclosure. In FIG. 21, the horizontal axis represents time [second] and the vertical axis represents amplitude [V] of the signal. The solid line in FIG. 21 represents amplitude A2 and the dashed line in FIG. 21 represents reflection signal yr (t). FIG. 21 shows a simulation result of amplitude A2 calculated by processing unit 54 when the disconnection occurs at a position 10 m away from the end portion facing relay apparatus 105 in transmission line 1 having a length of 11 m.

After calculating amplitude A2, processing unit 54 calculates reflection coefficient rc according to the following equation (12).

[Equation 12]

$$rc = \frac{A2}{A1} = \frac{|A2|}{|A1|} e^{-j\varphi} \qquad (12)$$

Figure 22:
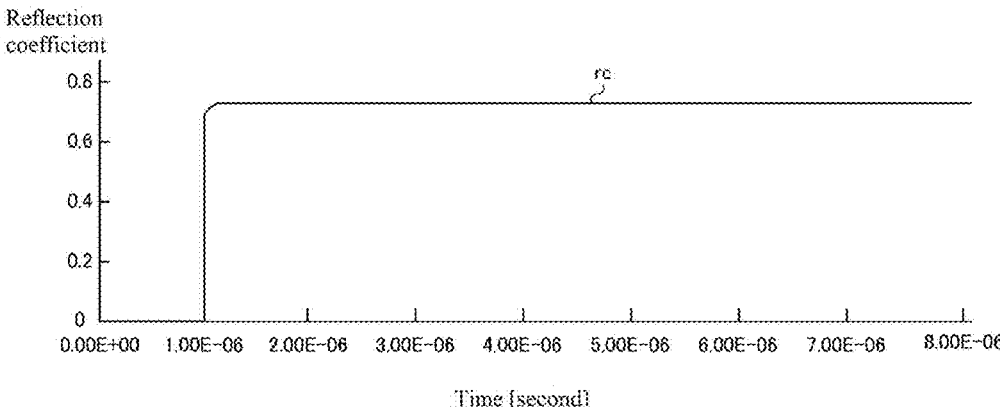
FIG. 22 is a diagram showing a simulation result of a reflection coefficient generated by the processing unit in the relay apparatus according to the fifth embodiment of the present disclosure.

FIG. 22 is a diagram showing a simulation result of a reflection coefficient generated by the processing unit in the relay apparatus according to the fifth embodiment of the present disclosure. In FIG. 22, the horizontal axis represents time [second] and the vertical axis represents reflection coefficient. The solid line in FIG. 22 indicates reflection coefficient rc. FIG. 22 shows a simulation result of reflection coefficient rc calculated by processing unit 54 when the disconnection occurs at a position 10 m away from the end portion facing relay apparatus 105 in transmission line 1 having a length of 11 m, similarly to FIG. 21.

Processing unit 54 can detect an abnormality in transmission line 1 based on time-course changes in amplitude A2 and reflection coefficient rc. More specifically, after calculating reflection coefficient rc, processing unit 54 compares reflection coefficient rc with a predetermined threshold value Th3, and determines whether or not the disconnection has occurred in transmission line 1 based on the comparison result.

As shown in the equation (12), reflection coefficient rc changes according to the ratio of the absolute values of amplitudes A1 and A2 and phase difference Φ. When the specific impedance of transmission line 1 does not change, phase difference Φ is a constant value corresponding to distance L from the end portion facing relay apparatus 105 in transmission line 1 to the reflection point of measurement signal ys (t). For example, processing unit 54 can calculate distance L based on the calculated reflection coefficient rc and the attenuation amount per unit length of the signal in transmission line 1.

In relay apparatus 105 according to the fifth embodiment of the present disclosure, processing unit 54 may be configured to calculate phase difference Φ in addition to reflection coefficient rc, and determine whether or not the disconnection has occurred in transmission line 1 based on reflection coefficient rc and phase difference Φ. More specifically, processing unit 54 comprehensively considers the determination results based on reflection coefficient rc and based on the phase difference Φ, and determines whether or not the disconnection has occurred in transmission line 1.

Sixth Embodiment

Compared with relay apparatus 104 according to the fourth embodiment and relay apparatus 105 according to the fifth embodiment, the present embodiment relates to a relay apparatus 106 that calculates phase difference Φ and reflection coefficient rc using a signal including a component of a frequency (f+fb). Relay apparatus 106 is the same as relay apparatus 104 according to the fourth embodiment and relay apparatus 105 according to the fifth embodiment except for the contents described below.

Figure 23:
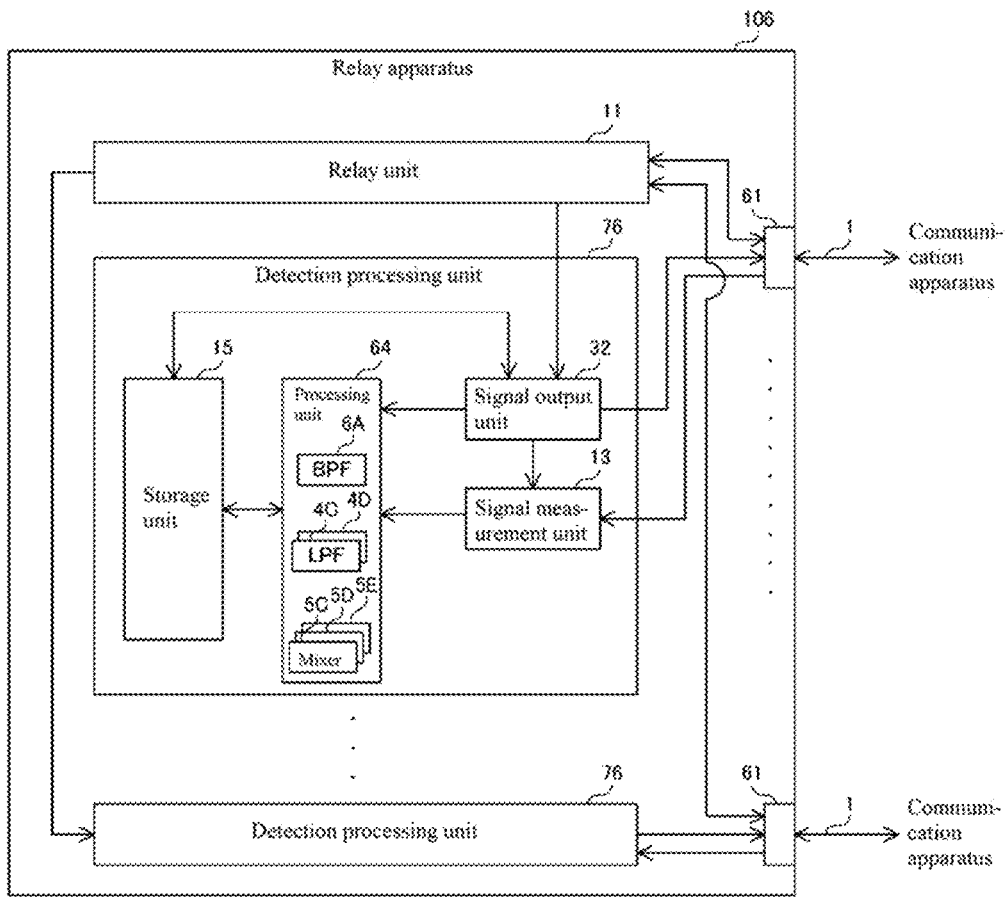
FIG. 23 is a diagram showing a configuration of a relay apparatus according to a sixth embodiment of the present disclosure.

FIG. 23 is a diagram showing a configuration of a relay apparatus according to a sixth embodiment of the present disclosure. Referring to FIG. 23, relay apparatus 106 includes a detection processing unit 76 instead of detection processing unit 74 as compared with relay apparatus 104 according to the fourth embodiment. Compared to detection processing unit 74, detection processing unit 76 includes a signal output unit 32 instead of signal output unit 22 and includes a processing unit 64 instead of processing unit 44. Processing unit 64 includes a BPF 6A, LPFs 4C and 4D, and mixers 5C, 5D, and 5E.

Compared to signal output unit 22, signal output unit 32 outputs a digital measurement signal ysdF (t) that includes a component of the frequency (f+fb) to processing unit 64 instead of outputting digital measurement signal ysdP (t) to processing unit 44. Here, fb is a value smaller than f and close to 0. Digital measurement signal ysdF (t) is expressed by the following equation (13) where digital measurement signal ysd (t) is a cosine wave and the angular frequencies corresponding to frequencies fb are ωb.

[Equation 13]

$$ysdF(t) = A1 \times \cos(\omega t + \omega bt) \qquad (13)$$

Processing unit 64 calculates phase difference Φ and reflection coefficient rc by using the output signal output from BPF 6A by inputting the multiplication signal of digital measurement signal ysdF (t) including the component of the frequency (f+fb) and difference signal ydiff (t) to BPF 6A for extracting the component of the frequency (fb). BPF 6A is an example of a third filter.

More specifically, processing unit 64 receives digital measurement signal ysd (t) from signal output unit 32 and generates difference signal ydiff (t) by subtracting digital measurement signal ysd (t) received from signal output unit 32 from digital response signal ymd (t) received from signal measurement unit 13.

Processing unit 64 generates a multiplication signal Ms3 (t) by multiplying digital measurement signal ysdF (t) and difference signal ydiff (t) using mixer 5C. Multiplication signal Ms3 (t) is expressed by the following equation (14).

[Equation 14]

$$Ms3(t) = \frac{A1 \times A2}{2} \{\cos(2\omega t + \omega bt + \varphi) + \cos(\omega bt - \varphi)\} \quad (14)$$

As shown in Equation (14), multiplication signal Ms3 ($t$) includes high-frequency components FH of angular frequencies $2\omega t$ that are twice frequencies f of measurement signal ys (t) and low-frequency components FL of angular frequencies $\omega bt$.

Processing unit 64 attenuates high-frequency components FH of multiplication signal Ms3 using BPF 6A to generate an extraction signal MsD3 ($t$) that is a signal obtained by extracting low-frequency components FL of multiplication signal Ms3 ($t$). BPF 6A receives multiplication signal Ms3 ($t$) and outputs extraction signal MsD3 ($t$). Extraction signal MsD3 ($t$) output from BPF 6A is expressed by the following equation (15).

[Equation 15]

$$MsD3(t) = \frac{A1 \times A2}{2} \times \cos(\omega bt - \varphi) \quad (15)$$

Processing unit 64 uses mixer 5D to multiply extraction signal MsD3 ($t$) and a digital signal Dfb (t) having amplitude A3 and including the components of frequencies fb to generate a multiplication signal Ms4 ($t$). In addition, processing unit 64 uses mixer 5E to generate a multiplication signal Ms5 ($t$) by multiplying extraction signal MsD3 ($t$) and a digital signal DfbP (t) that is a signal obtained by shifting the phase of the component of frequency fb included in digital signal Dfb (t) by $\pi/2$. Here, amplitude A3 may be the same as amplitude A1. Multiplication signals Ms4 ($t$) and Ms5 ($t$) are expressed by the following equations (16) and (17).

[Equation 16]

$$Ms4(t) = \frac{A1 \times A2 \times A3}{4} \{\cos(2\omega bt - \varphi) + \cos\varphi\} \quad (16)$$

[Equation 17]

$$Ms5(t) = \frac{A1 \times A2 \times A3}{4} \{\sin(2\omega bt - \varphi) + \sin\varphi\} \quad (17)$$

As shown in Equations (16) and (17), multiplication signals Ms4 ($t$) and Ms5 ($t$) include a frequency-component Fcb that is twice frequency-component fb and a direct-current component Dcb that is a constant term.

Processing unit 64 attenuates frequency-component Fcb of multiplication signals Ms4 ($t$) and Ms5 ($t$) using LPFs 4C and 4D to generate extraction signals MsD4 ($t$) and MsD5 ($t$) that are signals obtained by extracting direct-current component Dcb of multiplication signals Ms4 ($t$) and Ms5 ($t$). The cut-off frequencies of LPFs 4C and 4D are, for example, equal to or lower than twice frequency fb. LPFs 4C and 4D attenuate a frequency-component based on frequency fb.

LPF 4C receives multiplication signal Ms4 ($t$) and outputs extraction signal MsD4 ($t$). LPF 4D receives multiplication signal Ms5 ($t$) and outputs extraction signal MsD5 ($t$). Extraction signal MsD4 ($t$) that is the output signal from LPF 4C and extraction signal MsD5 ($t$) that is the output signal from LPF 4D are expressed by the following equations (18) and (19).

[Equation 18]

$$MsD4(t) = \frac{A1 \times A2 \times A3}{4} \times \cos\varphi \quad (18)$$

[Equation 19]

$$MsD5(t) = \frac{A1 \times A2 \times A3}{4} \times \sin\varphi \quad (19)$$

Processing unit 64 calculates phase difference Φ using extraction signals MsD4 ($t$) and MsD5 ($t$) in accordance with the following equation (20).

[Equation 20]

$$\varphi = \tan^{-1}\left\{\frac{MsD5(t)}{MsD4(t)}\right\} \quad (20)$$

After calculating phase difference Φ, processing unit 64 calculates distance L corresponding to the calculated phase difference Φ in accordance with the above-described equation (2).

Further, processing unit 64 calculates amplitude A2 of reflection signal yr (t) according to the following equation (21) using the known amplitude A1 of measurement signal ys (t) and the generated extraction signals MsD4 ($t$) and MsD5 ($t$).

[Equation 21]

$$A2 = \frac{4 \times \sqrt{MsD4(t)^2 + MsD5(t)^2}}{A1 \times A3} \quad (21)$$

After calculating amplitude A2, processing unit 64 calculates reflection coefficient rc in accordance with the above-described equation (12). Processing unit 64 compares the calculated reflection coefficient rc with threshold value Th3, and determines whether or not the disconnection occurs in transmission line 1 based on the comparison result.

It should be understood that the above-described embodiments are illustrative in all respects and are not restrictive. The scope of the present invention is defined not by the above description but by the claims, and is intended to include all modifications within the meaning and scope equivalent to the claims.

The above description includes the following additional features.

[Supplementary Note 1]

A detection apparatus, comprising: a signal output unit configured to output a measurement signal that includes a component having a first frequency to a transmission line; a signal measurement unit configured to measure a response signal from the transmission line to the measurement signal output from the signal output unit; and a processing unit configured to generate a difference signal that is a difference between the response signal measured by the signal measurement unit and a reference signal that based on the measurement signal, calculate an index value that indicate a strength of a correlation between the reference signal and the difference signal, and detect an abnormality in the transmission line on the basis of the calculated index value, wherein the processing unit calculates a distance from an end facing the detection apparatus in the transmission line to a reflection point at which the measurement signal is reflected in the transmission line based on the index value, and specifies a position of occurrence of the abnormality based on the calculated distance.

[Supplementary Note 2]

A detection apparatus, comprising: a signal output unit configured to output a measurement signal that includes a component having a first frequency to a transmission line; a signal measurement unit configured to measure a response signal from the transmission line the measurement signal output from the signal output unit; and a processing unit configured to generate a difference signal that is a difference between the response signal measured by the signal measurement unit and a reference signal that is based on the measurement signal, calculate an index value that indicate a strength of a correlation between the reference signal and the difference signal, and detect an abnormality in the transmission line on the basis of the calculated index value, wherein the transmission line does not include a termination resistor.

[Supplementary Note 3]

A detection apparatus, comprising: a signal output unit configured to output a sine wave as a measurement signal to a transmission line; a signal measurement unit configured to measure a response signal from the transmission line to the measurement signal output from the signal output unit; and a processing unit configured to generate a difference signal that is a difference between the response signal measured by the signal measurement unit and a reference signal that is based on the measurement signal, and detect a disconnection in the transmission line based on a phase difference between the reference signal and the difference signal.

REFERENCE SIGNS LIST 1 transmission line
11 relay unit
12, 22, 32 signal output unit
13, 23 signal measurement unit
14, 24, 34, 44, 54, 64 processing unit
15 storage unit
16 delay adjustment unit
61 communication port
71, 72, 73, 74, 75, 76 detection processing unit
101, 102, 103, 104, 105, 106 relay apparatus
111 communication apparatus
301 communication system
4A, 4B, 4C, 4D LPF
5A, 5B, 5C, 5D, 5E mixer
6A BPF

The invention claimed is:

1. A detection apparatus comprising:
signal output circuitry configured to output a measurement signal that includes a component having a first frequency to a transmission line;
signal measurement circuitry configured to measure a response signal, from the transmission line, to the measurement signal output from the signal output circuitry; and
processing circuitry configured to
generate a difference signal that is a difference between the response signal measured by the signal measurement circuitry and a reference signal that is based on the measurement signal,
calculate an index value that indicates a strength of a correlation between the reference signal and the generated difference signal by performing correlation processing using, as direct operands to the correlation processing, (i) the reference signal that is based on the measurement signal and (ii) the generated difference signal that is the difference between the response signal measured by the signal measurement circuitry and the reference signal that is based on the measurement signal, and
detect an abnormality in the transmission line on the basis of the calculated index value.

2. The detection apparatus according to claim 1, wherein the processing circuitry is configured to calculate, as the index value, a phase difference between (i) a component having the first frequency and included in the reference signal and (ii) a component having the first frequency and included in the generated difference signal.

3. The detection apparatus according to claim 1, wherein the processing circuitry is configured to calculate, as the index value, a reflection coefficient between the reference signal and the generated difference signal.

4. The detection apparatus according to claim 1, wherein the processing circuitry is configured to calculate the index value by using (i) an output signal output from a first filter in response to input, into the first filter, of a multiplication signal obtained from the generated difference signal and the reference signal, the first filter being configured to extract a direct-current component, and (ii) an output signal output from a second filter in response to input, into the second filter, of a multiplication signal obtained from the generated difference signal and a signal that is obtained by shifting a phase of a component having the first frequency and included in the reference signal by $\pi/2$, the second filter being configured to extract a direct-current component.

5. The detection apparatus according to claim 1, wherein the processing circuitry is configured to calculate the index value by using an output signal output from a third filter in response to input, into the third filter, of a multiplication signal obtained from the generated difference signal and a signal that includes a component having a second frequency different from the first frequency, the third filter being configured to extract a component having a difference frequency between the first frequency and the second frequency.

6. The detection apparatus according to claim 2, wherein the processing circuitry is configured to calculate the phase difference by using an argument of a complex analysis signal of the reference signal and an argument of a complex analysis signal of the generated difference signal.

7. The detection apparatus according to claim 1, wherein the reference signal is a signal obtained by making a delay adjustment to the measurement signal.

8. The detection apparatus according to claim 7, wherein a delay amount of the reference signal relative to the measurement signal is allowed to be changed and set.

9. The detection apparatus according to claim 1, wherein the reference signal is the response signal measured by the signal measurement circuitry upon a steady-state time.

10. The detection apparatus according to claim 1, wherein the processing circuitry is configured to detect a position of occurrence of the abnormality.

11. A detection method performed in a detection apparatus, comprising:
outputting a measurement signal that includes a component having a first frequency to a transmission line;
measuring a response signal, from the transmission line, to the measurement signal;
generating, with processing circuitry, a difference signal that is a difference between the response signal and a reference signal that is based on the measurement signal;

calculating, with the processing circuitry, an index value that indicates a strength of a correlation between the reference signal and the generated difference signal by performing correlation processing using, as direct operands to the correlation processing, (i) the reference signal that is based on the measurement signal and (ii) the generated difference signal that is the difference between the response signal and the reference signal that is based on the measurement signal; and detecting, with the processing circuitry, an abnormality in the transmission line on the basis of the calculated index value.

12. The detection method according to claim 11, wherein the calculating includes calculating, as the index value, a phase difference between (i) a component having the first frequency and included in the reference signal and (ii) a component having the first frequency and included in the generated difference signal.

13. The detection method according to claim 11, wherein the calculating includes calculating, as the index value, a reflection coefficient between the reference signal and the generated difference signal.

14. The detection method according to claim 11, wherein the calculating includes calculating the index value by using (i) an output signal output from a first filter in response to input, into the first filter, of a multiplication signal obtained from the generated difference signal and the reference signal, the first filter being configured to extract a direct-current component, and (ii) an output signal output from a second filter in response to input, into the second filter, of a multiplication signal obtained from the generated difference signal and a signal that is obtained by shifting a phase of a component having the first frequency and included in the reference signal by $\pi/2$, the second filter being configured to extract a direct-current component.

15. The detection method according to claim 11, wherein the calculating includes calculating the index value by using an output signal output from a third filter in response to input, into the third filter, of a multiplication signal obtained from the generated difference signal and a signal that includes a component having a second frequency different from the first frequency, the third filter being configured to extract a component having a difference frequency between the first frequency and the second frequency.

16. The detection method according to claim 12, wherein the calculating includes calculating the phase difference by using an argument of a complex analysis signal of the reference signal and an argument of a complex analysis signal of the generated difference signal.

17. The detection method according to claim 11, wherein the reference signal is a signal obtained by making a delay adjustment to the measurement signal.

18. The detection method according to claim 17, wherein a delay amount of the reference signal relative to the measurement signal is allowed to be changed and set.

19. The detection method according to claim 11, wherein the reference signal that is the response signal measured upon a steady-state time.

20. The detection method according to claim 11, further comprising detecting a position of occurrence of the abnormality.

* * * * *